US007910051B2

(12) United States Patent
Zimmermann et al.

(10) Patent No.: US 7,910,051 B2
(45) Date of Patent: Mar. 22, 2011

(54) LOW-ENERGY METHOD FOR FABRICATION OF LARGE-AREA SPUTTERING TARGETS

(75) Inventors: Stefan Zimmermann, Laufenburg (DE); Steve A. Miller, Canton, MA (US); Prabhat Kumar, Framingham, MA (US); Mark Gaydos, Nashua, NH (US)

(73) Assignees: H.C. Starck GmbH, Goslar (DE); H.C. Starck, Inc., Newton, MA (US)

( * ) Notice: Subject to any disclaimer, the term of this patent is extended or adjusted under 35 U.S.C. 154(b) by 610 days.

(21) Appl. No.: 11/935,099

(22) Filed: Nov. 5, 2007

(65) Prior Publication Data
US 2008/0216602 A1 Sep. 11, 2008

Related U.S. Application Data

(63) Continuation-in-part of application No. PCT/EP2006/003969, filed on Apr. 28, 2006.

(60) Provisional application No. 60/678,052, filed on May 5, 2005.

(51) Int. Cl.
C22F 3/02 (2006.01)
C23C 14/00 (2006.01)
B05D 1/12 (2006.01)

(52) U.S. Cl. .............. 419/61; 204/298.12; 204/298.13; 427/181; 427/446

(58) Field of Classification Search .............. 419/8, 9, 419/61; 427/180, 191, 201, 181, 446, 455; 204/298.13, 298.12
See application file for complete search history.

(56) References Cited

U.S. PATENT DOCUMENTS

| | | | |
|---|---|---|---|
| 3,990,784 A | 11/1976 | Gelber | |
| 4,011,981 A | 3/1977 | Danna et al. | |
| 4,073,427 A | 2/1978 | Keifert et al. | |
| 4,140,172 A | 2/1979 | Corey | |
| 4,202,932 A | 5/1980 | Chen et al. | |
| 4,291,104 A | 9/1981 | Keifert | |
| 4,459,062 A | 7/1984 | Siebert | |
| 4,483,819 A | 11/1984 | Albrecht et al. | |
| 4,508,563 A | 4/1985 | Bernard et al. | |
| 4,537,641 A | 8/1985 | Albrecht et al. | |
| 4,722,756 A | 2/1988 | Hard | |
| 4,818,629 A | 4/1989 | Jenstrom et al. | |
| 4,915,745 A | 4/1990 | Pollock et al. | |
| 4,964,906 A | 10/1990 | Fife | |
| 5,091,244 A | 2/1992 | Biornard | |
| 5,147,125 A | 9/1992 | Austin | |
| 5,242,481 A | 9/1993 | Kumar | |
| 5,270,858 A | 12/1993 | Dickey | |
| 5,302,414 A | 4/1994 | Alkhimov et al. | |
| 5,305,946 A | 4/1994 | Heilmann | |
| 5,466,355 A * | 11/1995 | Ohhashi et al. .......... 204/298.13 |
| 5,580,516 A | 12/1996 | Kumar | |
| 5,612,254 A | 3/1997 | Mu et al. | |
| 5,679,473 A | 10/1997 | Murayama et al. | |
| 5,693,203 A | 12/1997 | Ohhashi et al. | |
| 5,795,626 A | 8/1998 | Gabel et al. | |
| 5,859,654 A | 1/1999 | Radke et al. | |
| 5,954,856 A | 9/1999 | Pathare et al. | |
| 5,972,065 A | 10/1999 | Dunn et al. | |
| 5,993,513 A | 11/1999 | Fife | |
| 6,136,062 A | 10/2000 | Loffelholz et al. | |
| 6,139,913 A | 10/2000 | Van Steenkiste et al. | |
| 6,171,363 B1 | 1/2001 | Shekhter et al. | |
| 6,189,663 B1 | 2/2001 | Smith et al. | |
| 6,197,082 B1 | 3/2001 | Dorvel et al. | |
| 6,238,456 B1 | 5/2001 | Wolf et al. | |
| 6,258,402 B1 | 7/2001 | Hussary et al. | |
| 6,261,337 B1 | 7/2001 | Kumar | |
| 6,328,927 B1 | 12/2001 | Lo et al. | |
| 6,331,233 B1 | 12/2001 | Turner | |
| 6,444,259 B1 | 9/2002 | Subramanian et al. | |
| 6,482,743 B1 | 11/2002 | Sato | |
| 6,491,208 B2 | 12/2002 | James et al. | |
| 6,502,767 B2 | 1/2003 | Kay et al. | |
| 6,521,173 B2 | 2/2003 | Kumar et al. | |
| 6,558,447 B1 | 5/2003 | Shekhter et al. | |
| 6,589,311 B1 | 7/2003 | Han et al. | |
| 6,669,782 B1 | 12/2003 | Thakur | |
| 6,722,584 B2 | 4/2004 | Kay et al. | |
| 6,749,002 B2 | 6/2004 | Grinberg et al. | |

(Continued)

FOREIGN PATENT DOCUMENTS

DE 10253794 A1 6/2004

(Continued)

OTHER PUBLICATIONS

Ajdelsztajn et al., "Synthesis and Mechanical Properties of Nanocrytalline Ni Coatings Produced by Cold Gas Dynamic Spraying," 201 Surface and Coatings Tech. 3-4, pp. 1166-1172 (Oct. 2006).

(Continued)

*Primary Examiner* — Roy King
*Assistant Examiner* — Ngoclan T Mai
(74) *Attorney, Agent, or Firm* — Bingham McCutchen LLP

(57) ABSTRACT

In various embodiments, large-area sputtering targets are formed by providing a plurality of sputtering targets each comprising a backing plate and a refractory metal layer disposed thereon, and spray depositing a refractory metal powder on an interface between the sputtering targets, the refractory metal powder consisting essentially of the same metal as each refractory metal layer, thereby joining the refractory metal layers of the sputtering targets.

9 Claims, 14 Drawing Sheets

U.S. PATENT DOCUMENTS

| | | | |
|---|---|---|---|
| 6,759,085 | B2 | 7/2004 | Muehlberger |
| 6,770,154 | B2 | 8/2004 | Koenigsmann et al. |
| 6,773,969 | B2 | 8/2004 | Lee et al. |
| 6,905,728 | B1 | 6/2005 | Hu et al. |
| 6,911,124 | B2 | 6/2005 | Tang et al. |
| 6,919,275 | B2 | 7/2005 | Chiang et al. |
| 6,924,974 | B2 | 8/2005 | Stark |
| 6,953,742 | B2 | 10/2005 | Chen et al. |
| 6,962,407 | B2 | 11/2005 | Yamamoto et al. |
| 7,053,294 | B2 | 5/2006 | Tuttle et al. |
| 7,067,197 | B2 | 6/2006 | Michaluk et al. |
| 7,081,148 | B2 | 7/2006 | Koenigsmann et al. |
| 7,101,447 | B2 | 9/2006 | Turner |
| 7,108,893 | B2 | 9/2006 | Van Steenkiste et al. |
| 7,128,988 | B2 | 10/2006 | Lambeth |
| 7,164,205 | B2 | 1/2007 | Yamaji et al. |
| 7,170,915 | B2 | 1/2007 | McDonald |
| 7,175,802 | B2* | 2/2007 | Sandlin et al. .......... 419/8 |
| 7,183,206 | B2 | 2/2007 | Shepard |
| 7,192,623 | B2 | 3/2007 | Andre et al. |
| 7,208,230 | B2 | 4/2007 | Ackerman et al. |
| 7,399,335 | B2 | 7/2008 | Shekhter et al. |
| 7,479,299 | B2* | 1/2009 | Raybould et al. .......... 427/191 |
| 2002/0112789 | A1 | 8/2002 | Jepson et al. |
| 2002/0112955 | A1 | 8/2002 | Aimone et al. |
| 2002/0168466 | A1 | 11/2002 | Tapphorn et al. |
| 2003/0023132 | A1 | 1/2003 | Melvin et al. |
| 2003/0121777 | A1* | 7/2003 | Sato et al. .......... 204/298.12 |
| 2003/0190413 | A1 | 10/2003 | Van Steenkiste et al. |
| 2003/0219542 | A1 | 11/2003 | Ewasyshyn et al. |
| 2003/0232132 | A1 | 12/2003 | Muehlberger |
| 2004/0037954 | A1 | 2/2004 | Heinrich et al. |
| 2004/0065546 | A1 | 4/2004 | Michaluk et al. |
| 2004/0076807 | A1 | 4/2004 | Grinberg et al. |
| 2004/0126499 | A1* | 7/2004 | Heinrich et al. .......... 427/421 |
| 2005/0084701 | A1 | 4/2005 | Slattery |
| 2005/0120957 | A1 | 6/2005 | Kowalsky et al. |
| 2005/0142021 | A1 | 6/2005 | Aimone et al. |
| 2005/0153069 | A1* | 7/2005 | Tapphorn et al. .......... 427/180 |
| 2005/0155856 | A1 | 7/2005 | Oda |
| 2005/0220995 | A1* | 10/2005 | Hu et al. .......... 427/180 |
| 2005/0252450 | A1 | 11/2005 | Kowalsky et al. |
| 2006/0021870 | A1* | 2/2006 | Tsai et al. .......... 204/192.13 |
| 2006/0032735 | A1 | 2/2006 | Aimone et al. |
| 2006/0042728 | A1 | 3/2006 | Lemon et al. |
| 2006/0045785 | A1* | 3/2006 | Hu et al. .......... 419/5 |
| 2006/0090593 | A1 | 5/2006 | Liu |
| 2006/0121187 | A1 | 6/2006 | Haynes et al. |
| 2006/0207876 | A1* | 9/2006 | Matsumura et al. .......... 204/298.13 |
| 2006/0251872 | A1 | 11/2006 | Wang et al. |
| 2007/0089984 | A1* | 4/2007 | Gaydos et al. .......... 204/298.12 |
| 2007/0172378 | A1 | 7/2007 | Shibuya et al. |
| 2008/0078268 | A1 | 4/2008 | Shekhter et al. |
| 2008/0145688 | A1 | 6/2008 | Miller et al. |
| 2008/0171215 | A1 | 7/2008 | Kumar et al. |
| 2008/0271779 | A1 | 11/2008 | Miller et al. |
| 2010/0015467 | A1 | 1/2010 | Zimmermann et al. |
| 2010/0055487 | A1 | 3/2010 | Zimmermann et al. |
| 2010/0061876 | A1 | 3/2010 | Miller et al. |
| 2010/0086800 | A1 | 4/2010 | Miller et al. |

FOREIGN PATENT DOCUMENTS

| | | |
|---|---|---|
| EP | 0074803 A1 | 3/1983 |
| EP | 0484533 A1 | 5/1992 |
| EP | 0774315 A2 | 5/1997 |
| EP | 1066899 A2 | 1/2001 |
| EP | 1138420 A2 | 10/2001 |
| EP | 1350861 A1 | 10/2003 |
| EP | 1382720 A2 | 1/2004 |
| EP | 1413642 A1 | 4/2004 |
| GB | 2121441 A | 12/1983 |
| GB | 2394479 A | 4/2004 |
| JP | 06346232 | 12/1994 |
| RU | 2166421 C1 | 5/2001 |
| WO | WO-98/37249 A1 | 8/1998 |
| WO | WO-01/12364 A1 | 2/2001 |
| WO | WO-02/064287 A2 | 8/2002 |
| WO | WO-03062491 A2 | 7/2003 |
| WO | WO-03106051 A1 | 12/2003 |
| WO | WO-2004/074540 A1 | 9/2004 |
| WO | WO-2005073418 A1 | 8/2005 |
| WO | WO-2006/117144 | 11/2006 |
| WO | WO-2006117145 A2 | 11/2006 |
| WO | WO-2008/089188 A1 | 7/2008 |

OTHER PUBLICATIONS

Examination Report in European Patent Application No. 09172234.8, mailed Jun. 16, 2010 (3 pages).

Search Report in European Patent Application No. 09172234.8, dated Jan. 29, 2010 (7 pages).

"Cold Gas Dynamic Spray CGSM Apparatus," Tev Tech LLC, available at: http://www.tevtechllc.com/cold_gas.html (accessed Dec. 14, 2009).

"Cold Spray Process," Handbook of Thermal Spray Technology, pp. 77-84, (2004).

Gärtner et al., "The Cold Spray Process and its Potential for Industrial Applications," 15 J. of Thermal Sprsy Tech. 2, pp. 223-232 (Jun. 2006).

Hall et al., "The Effect of a Simple Annealing Heat Treatment on the Mechanical Properties of Cold-Sprayed Aluminum," 15 J. of Thermal Spray Tech. 2, pp. 233-238 (Jun. 2006.).

Hall et al., "Preparation of Aluminum Coatings Containing Homogeneous Nanocrystalline Microstructures Using the Cold Spray Process," JTTEES 17:352-359, (2008).

IPRP in International Patent Application No. PCT/EP2006/003967, dated Nov. 6, 2007 (15 pages).

IPRP in International Patent Application No. PCT/US2008/062434, dated Nov. 11, 2009 (21 pages).

IPRP in International Patent Application No. PCT/EP2006/003969, dated Nov. 6, 2007 (13 pages).

International Search Report and Written Opinion in International Patent Application No. PCT/US2007/087214, mailed Mar. 23, 2009 (13 pages).

IPRP in International Patent Application No. PCT/US2007/081200, dated Sep. 1, 2009 (17 pages).

IPRP in International Patent Application No. PCT/US2007/080282, dated Apr. 7, 2009 (15 pages).

Irissou et al., "Review on Cold Spray Process and Technology: Part I—Intellectual Property," 17 J. of Thermal Spray Tech. 4, pp. 495-516 (Dec. 2008).

Karthikeyan, "Cold Spray Technology: International Status and USA Efforts," ASB Industries, Inc. (Dec. 2004).

Li et al., "Effect of Annealing Treatment on the Microstructure and Properties of Cold-Sprayed Cu Coating," 15 J. Of Thermal Spray Tech. 2, pp. 206-211 (Jun. 2006).

Marx et al., "Cold Spraying—Innovative Layers for New Applications," 15 J. of Thermal Spray Tech. 2, pp. 177-183 (Jun. 2006).

Morito, "Preparation and Characterization of Sintered Mo-Re Alloys," 3 J. de Physique 7, Part 1, pp. 553-556 (1993).

Stoltenhoff et al., "An Analysis of the Cold Spray Process and its Coatings," 11 J. of Thermal Spray Tech. 4, pp. 542-550 (Dec. 2002).

Van Steenkiste et al., "Analysis of Tantalum Coatings Produced by the Kinetic Spray Process," 13 J. of Thermal Spray Tech. 2, pp. 265-273 (Jun. 2004).

* cited by examiner

Figure 14 B  The Cu has a flattened structure

Figure 15 Schematic Drawing of HCM Pot
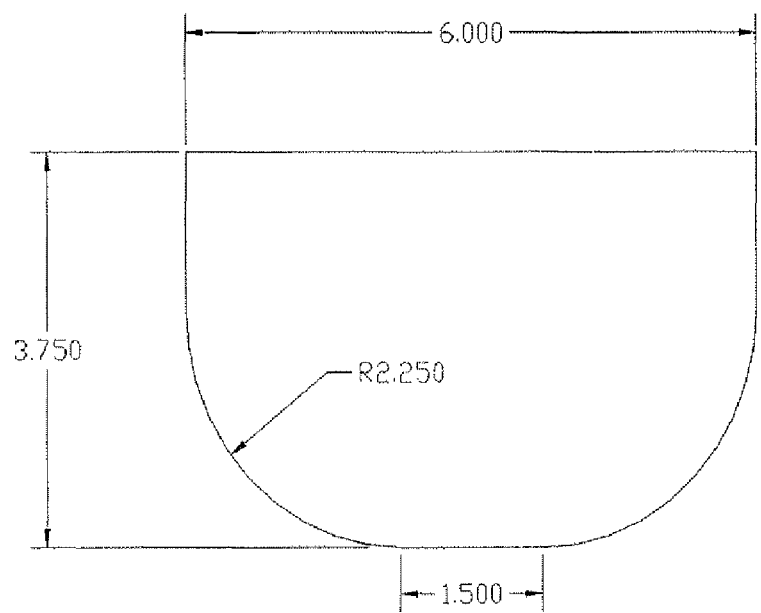

Figure 16: Net shape tantalum crucible made by cold spray technology
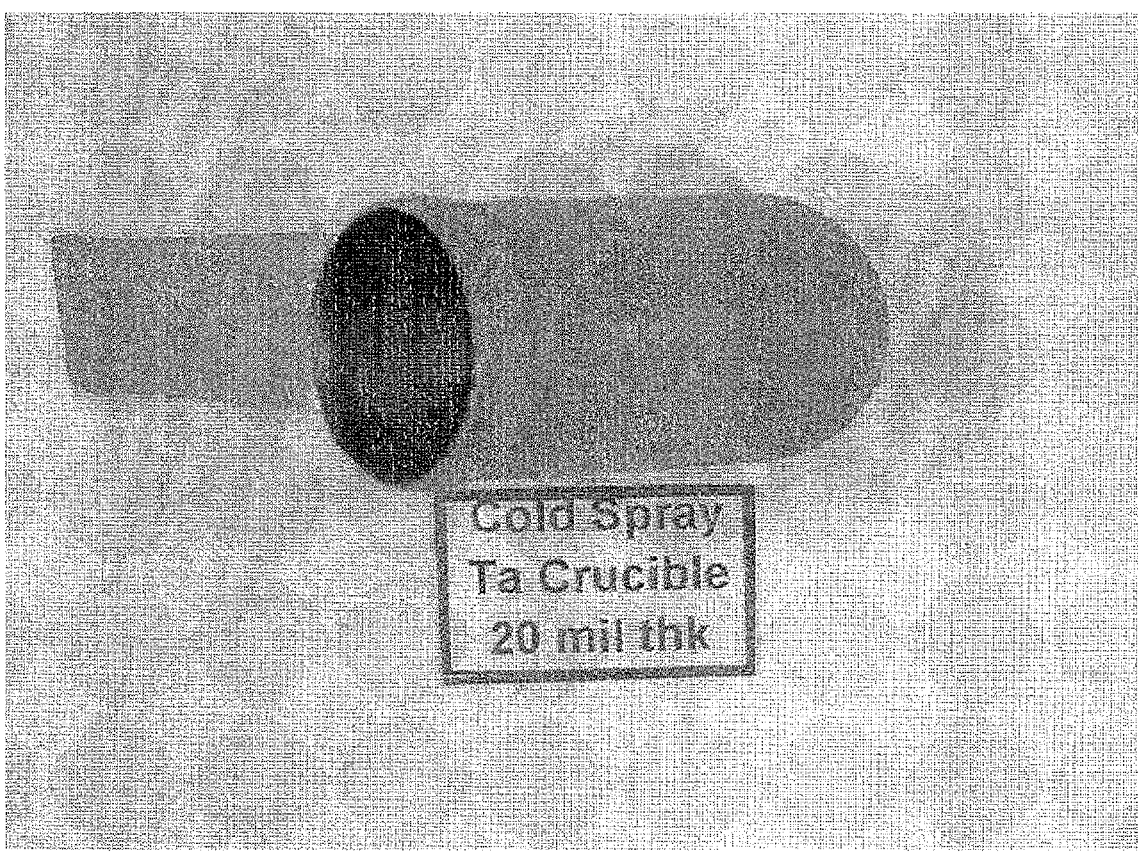

Figure 17  Microstructure of a Mo-Ti joint by electron-beam-welding process
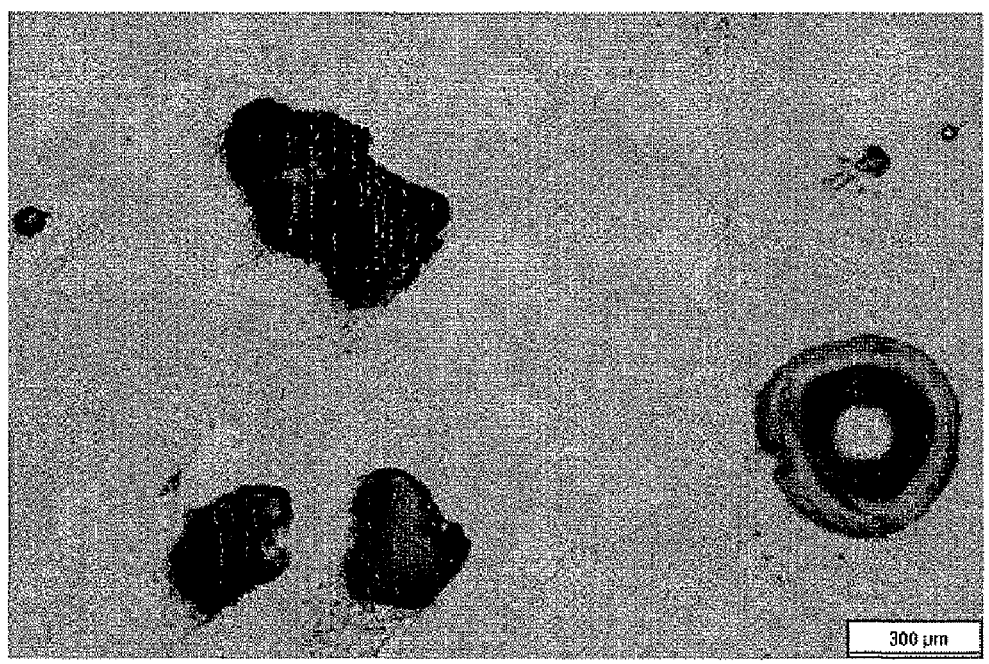

Figure 18 Microstructure of a Mo-Ti joint made by Hot Isostatic Press (HIP) process
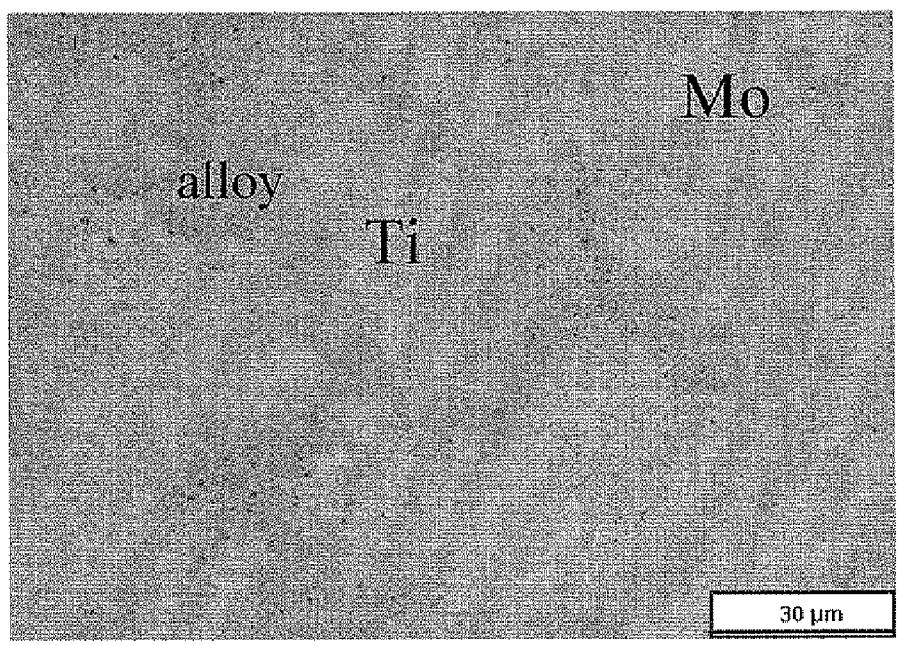

Figure 19 Microstructure of A Mo-Ti joint by Cold Spray Process
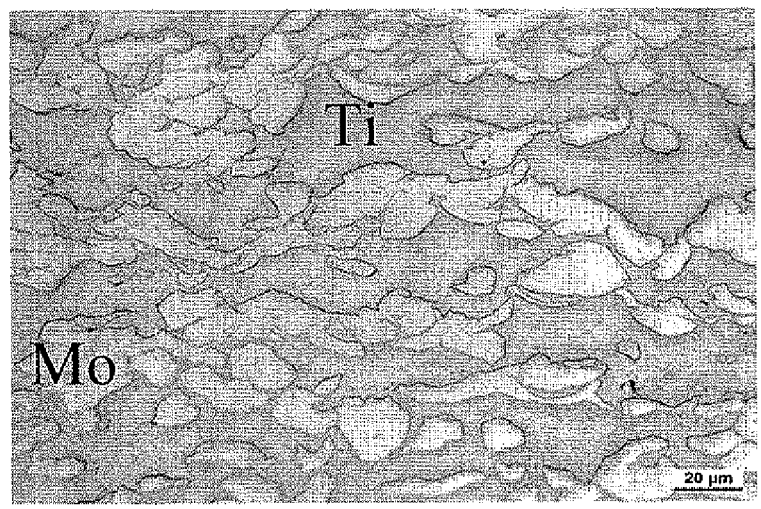
Figure 20 Tantalum coating on tantalum sheet
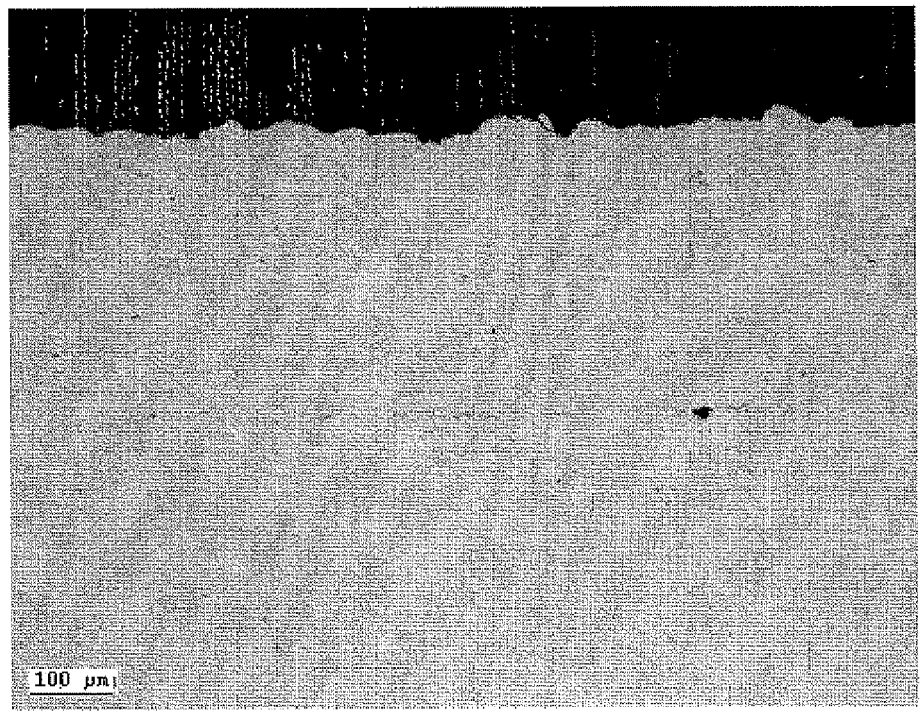

Figure 21 Tantalum coating on steel sheet with bond strength 54 MPa
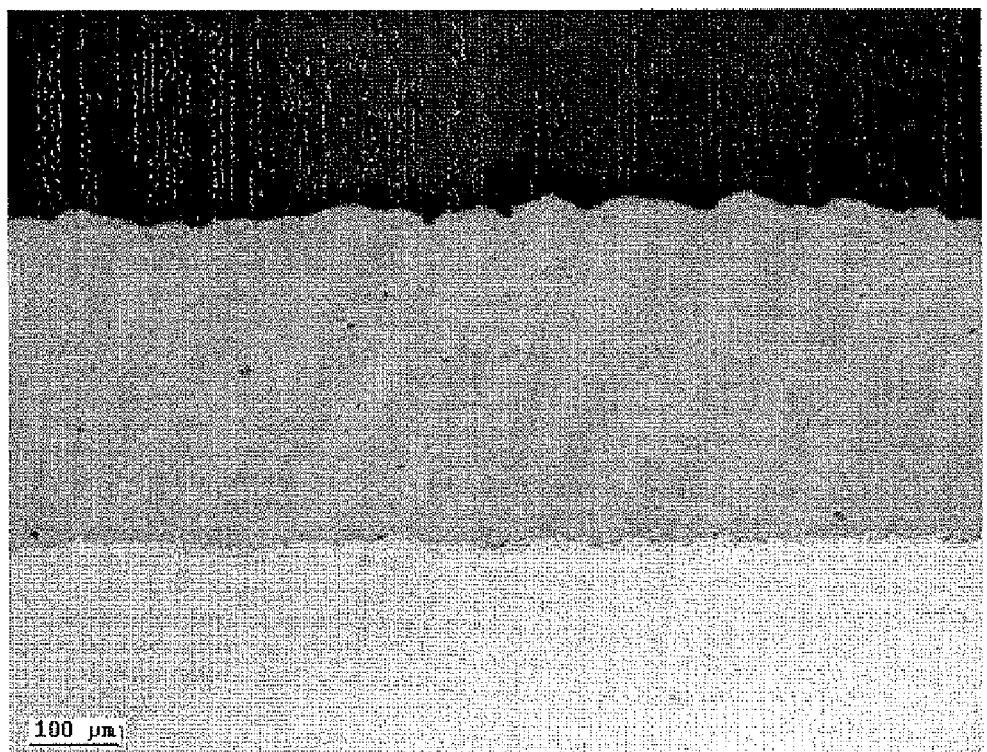

LOW-ENERGY METHOD FOR FABRICATION OF LARGE-AREA SPUTTERING TARGETS

RELATED APPLICATIONS

This application claims benefit to PCT/EP2006/003969 filed Apr. 28, 2006 and to U.S. Provisional Application 60/678,052 filed May 5, 2005, which are incorporated by reference in its entirety for all useful purposes.

BACKGROUND OF THE INVENTION a. Field of Invention

The present invention relates to a process for application of layers to sputter targets or X-ray anodes, which layers contain only small amounts of gaseous impurities, such as oxygen.

a. Description of the Prior Art

The application of refractory metal layers to surfaces displays numerous problems.

In the familiar processes, the metal is usually melted completely or partly, as a result of which the metals readily oxidize or take up other gaseous impurities. Conventional processes, such as deposit welding and plasma spraying, must therefore be carried out under an inert gas or in vacuo.

In this case, a high outlay on apparatus is necessary, the size of the structural components is limited and the content of gaseous impurities here is still not satisfactory.

The introduction of large amounts of heat transmitted into the object to be coated leads to a very high potential for distortion and ensures that these processes cannot be employed in the case of complex structural components, which often also comprise components which melt at low temperatures. Such structural components are, in particular, so-called sputtering targets, that is to say sources of metal which are employed in cathode sputtering of metal. Complex structural components must therefore be dismantled before processing, which as a rule means that processing is uneconomical in practice, and merely recycling of materials (scrapping) of the structural components is carried out.

In vacuum plasma spraying, impurities of tungsten and copper which originate from the electrodes used are moreover introduced into the layer, which as a rule is undesirable. For example, if layers of tantalum or niobium are used for corrosion protection, these impurities reduce the protective action of the coating by the formation of so-called micro-galvanic cells. In the case of sputter targets, this contamination can lead to components becoming unusable.

These processes moreover are melt metallurgy processes, which always involve their inherent disadvantages, such as, for example, unidirectional particle growth. This occurs in particular in laser processes, wherein a suitable powder is applied to the surface and is melted by a laser beam. A further problem lies in the porosity, which can be observed in particular if a metal powder is first applied and this is then melted with a heat source. It has indeed been attempted in WO 02/064287 to solve these problems by merely superficially melting and sintering the powder particles by a beam of energy, such as e.g. laser beams. However, the results are not always satisfactory, a high outlay on apparatus is necessary and the problems associated with an indeed reduced but nevertheless high introduction of heat into a complex structural component remain.

WO-A-03/106,051 discloses a method and an apparatus for low pressure cold spraying. In this process a coating of powder particles is sprayed in a gas substantially at ambient temperatures onto a workpiece. The process is conducted in a low ambient pressure environment which is less than atmospheric pressure to accelerate the sprayed powder particles. With this process a coating of a powder is formed on a workpiece.

EP-A-1,382,720 discloses another method and apparatus for low pressure cold spraying. In this process the target to be coated and the cold spray gun are located within a vacuum chamber at pressures below 80 kPa. With this process a workpiece is coated with a powder.

A BRIEF SUMMARY OF THE INVENTION

In view of this prior art it was the object of providing a novel process for recycling of sputtering targets or X-ray anodes in which no recycling of materials or dismantling of the target is necessary and which is distinguished by a low introduction of heat and outlay on apparatus and a broad applicability for various carrier materials and sputter materials or X-ray anode materials, and wherein the metal to be applied is not melted or superficially melted during processing.

The object of the present invention is achieved in that a desired refractory metal is applied to the desired surface by a process for the reprocessing or production of a sputter target or of an X-ray anode, wherein a gas flow forms a gas/powder mixture with a powder of a material chosen from the group consisting of niobium, tantalum, tungsten, molybdenum, titanium, zirconium, mixtures of two or more thereof and alloys thereof with at least two thereof or with other metals, the powder has a particle size of 0.5 to 150 μm, wherein a supersonic speed is imparted to the gas flow and the jet of supersonic speed is directed on to the surface of the object to be reprocessed or produced.

BRIEF DESCRIPTION OF THE FIGURES

FIG. 15: Schematic Drawing of HCM Pot.

FIG. 16: a fabricated tantalum crucible.

FIG. 17: Microstructure of a Mo—Ti joint by electron-beam-welding process.

FIG. 18: Microstructure of a Mo—Ti joint made by Hot Iso-static Press (HIP) process.

FIG. 19: Microstructure of a Mo—Ti joint by cold spray process.

FIG. 20: Tantalum coating on tantalum sheet.

FIG. 21: Tantalum coating on steel sheet with bond strength 54 MPa.

A DETAILED DESCRIPTION OF THE INVENTION

Figure 1:
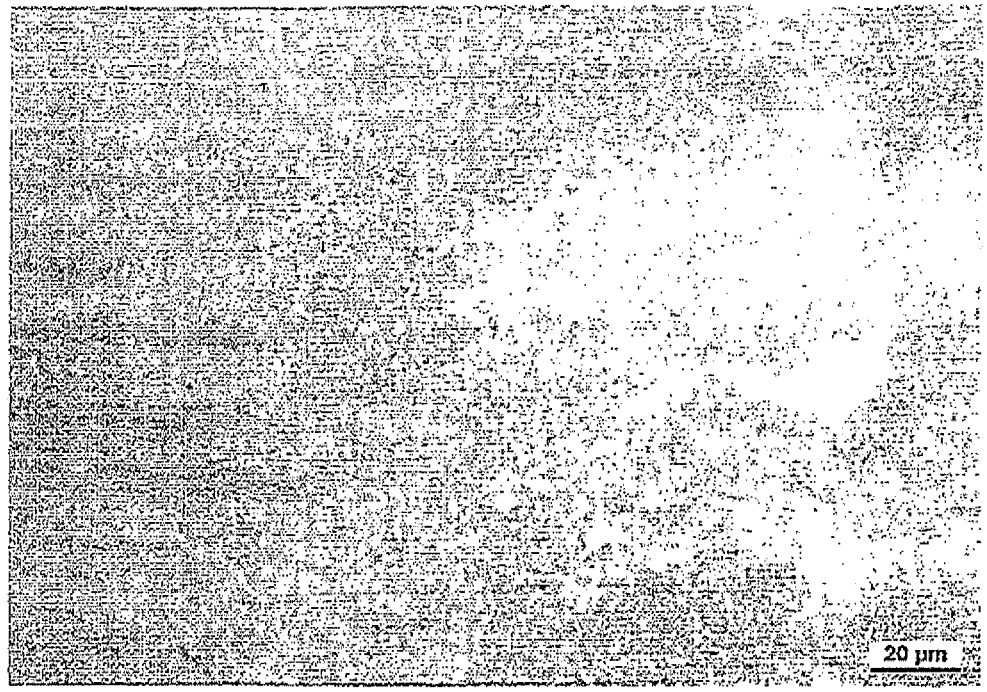
FIG. 1: Non-etched cross-section of a tantalum layer, process-gas helium.
Figure 2:
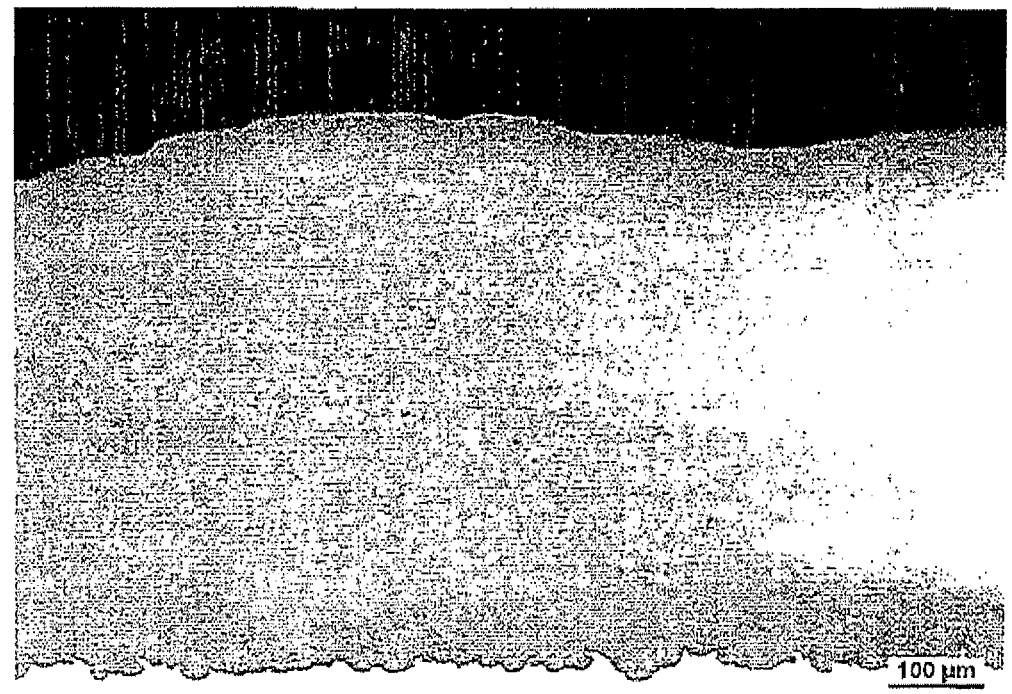
FIG. 2: Non-etched cross-section of a tantalum layer, process gas helium, general view of relatively low magnification.
Figure 3:
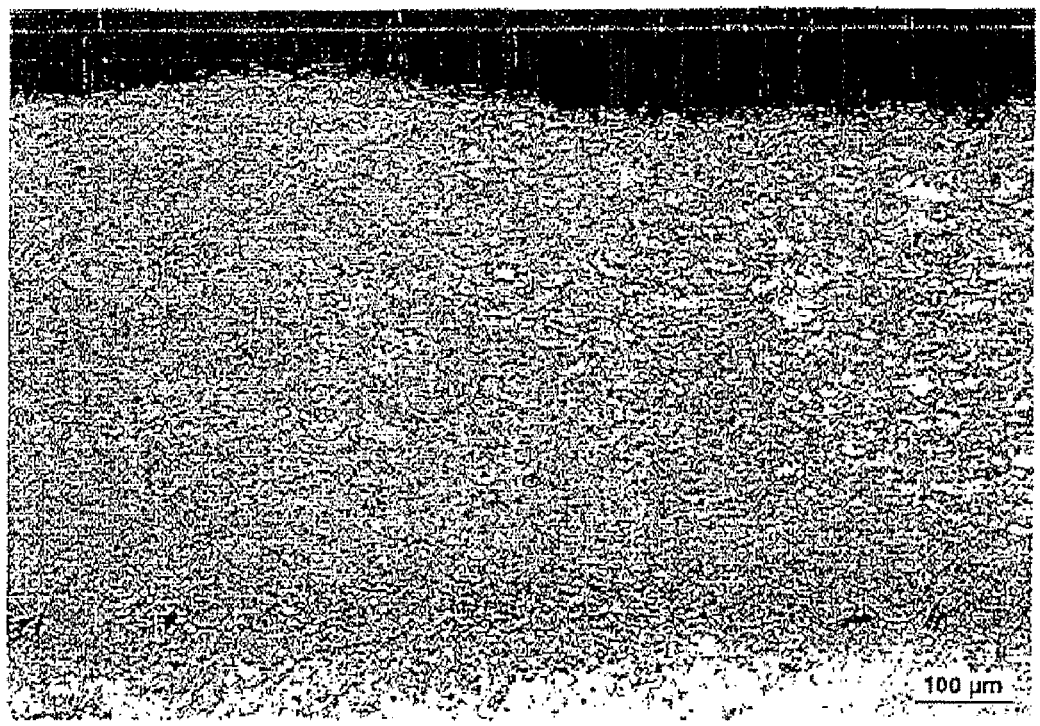
FIG. 3: Cross-section, etched with hydrofluoric acid, of a tantalum layer, process gas helium, general view of relatively low magnification.
Figure 4:
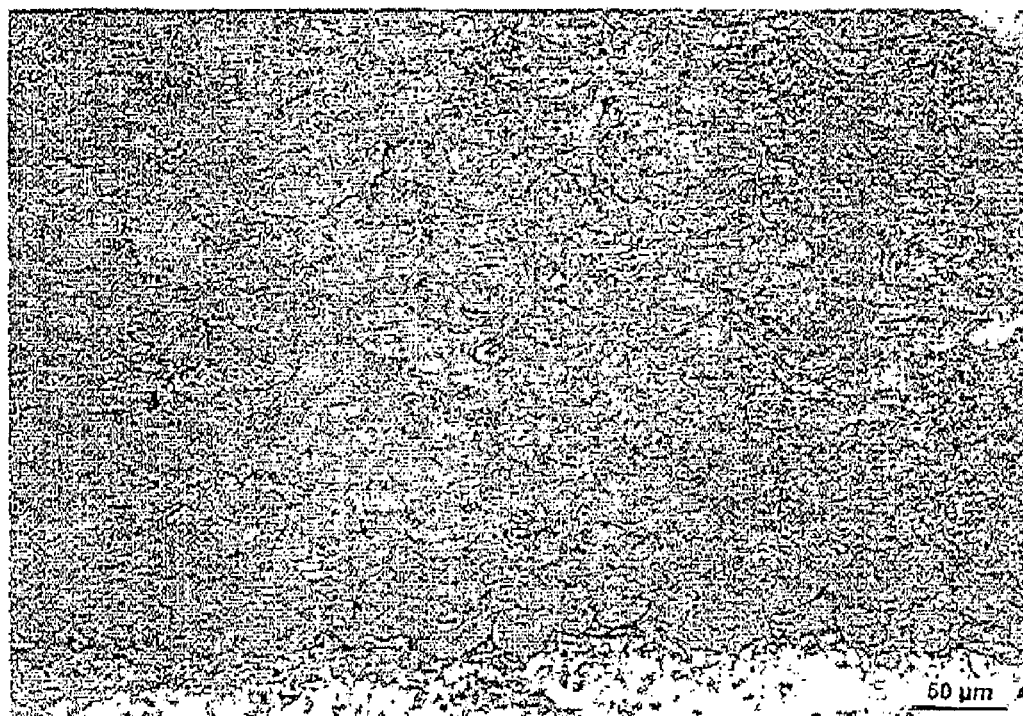
FIG. 4: Cross-section, etched with hydrofluoric acid, of a tantalum layer, process gas helium.
Figure 5:
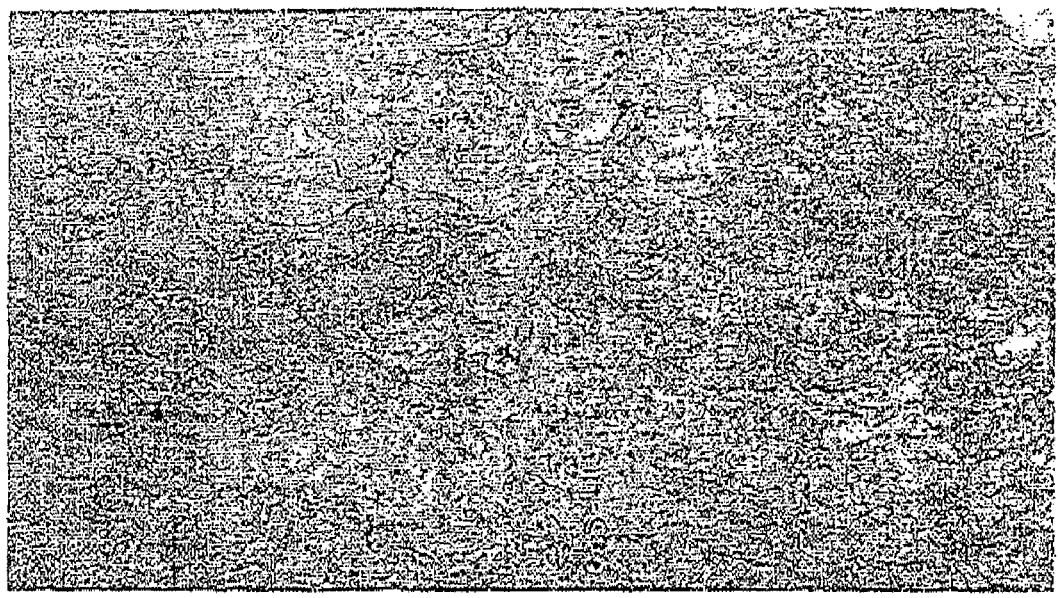
FIG. 5: Image section used for determination of the porosity, cross-section of a tantalum layer, process gas helium.
Figure 6:
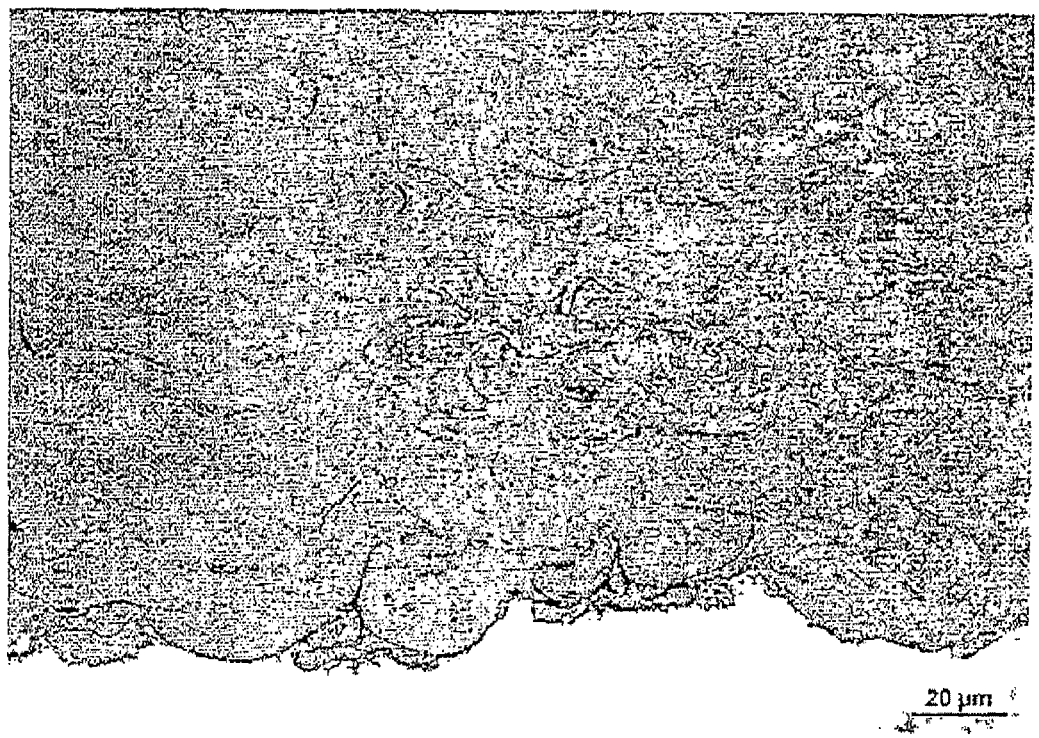
FIG. 6: Cross-section, etched with hydrofluoric acid, of a tantalum layer, interface to the substrate, process gas helium
Figure 7:
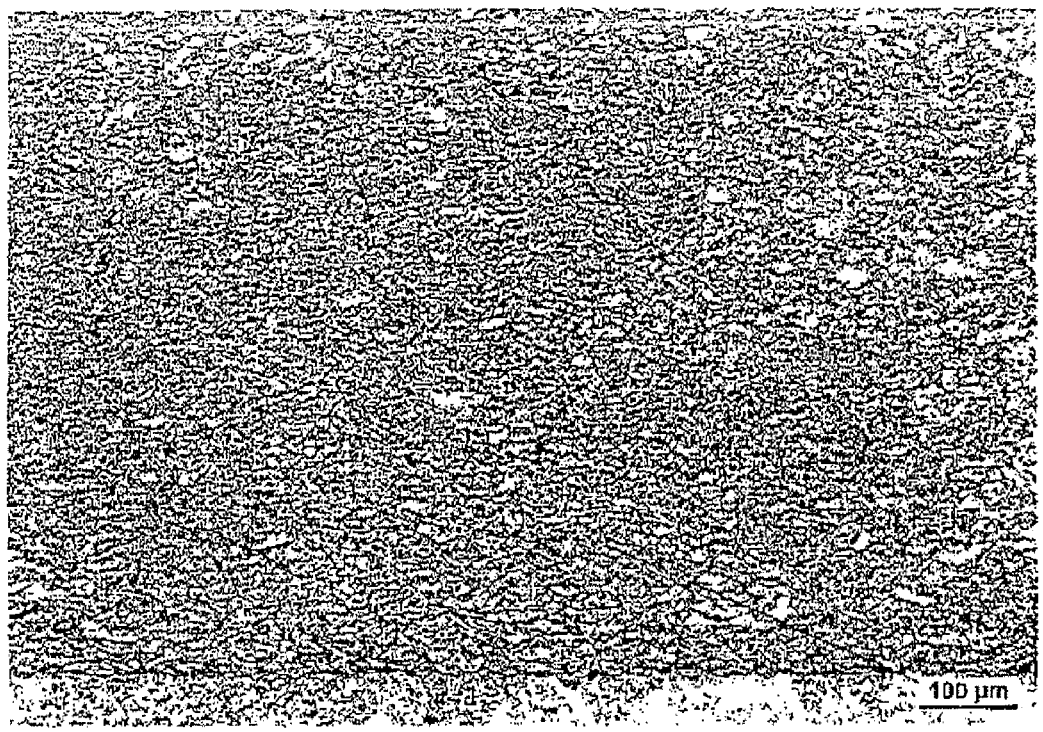
FIG. 7: Non-etched cross-section of a tantalum layer, process gas nitrogen, general view of relatively low magnification.
Figure 8:
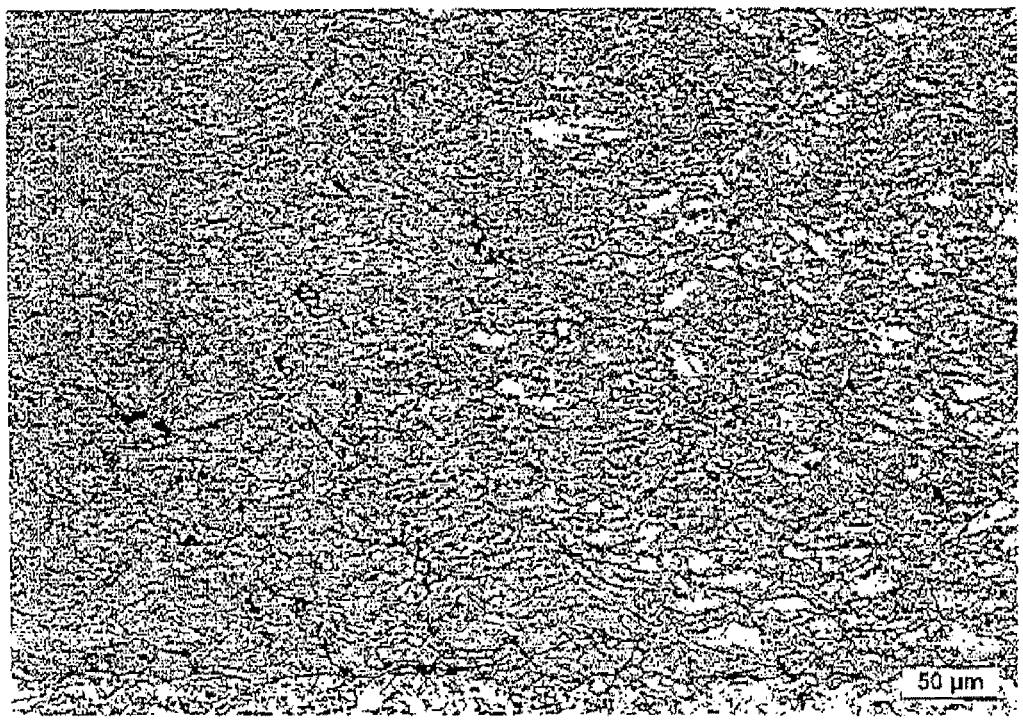
FIG. 8: Non-etched cross-section of a tantalum layer, process gas nitrogen.
Figure 9:
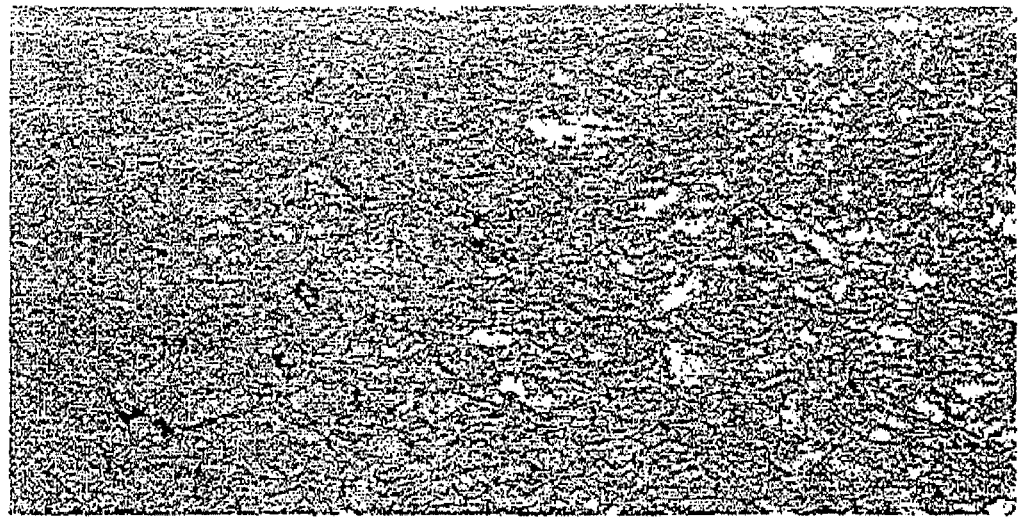
FIG. 9: Image section used for determination of the porosity, cross-section of a tantalum layer, process gas nitrogen.
Figure 10:
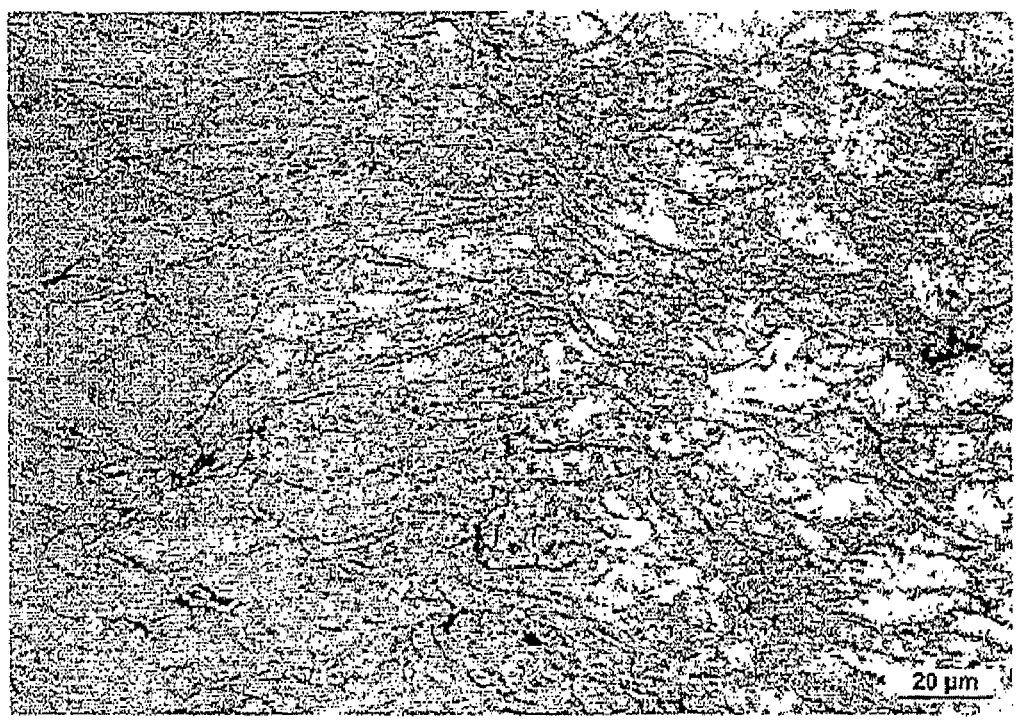
FIG. 10: Non-etched cross-section of a tantalum layer, process gas nitrogen, high magnification.

Processes in which, in contrast to the conventional processes of thermal spraying (flame, plasma, high-velocity flame, arc, vacuum plasma, low pressure plasma spraying) and deposit welding, no superficial melting or melting of the coating material, caused by thermal energy generated in the coating apparatus, occurs are in general suitable for this. In this context, contact with a flame or hot combustion gases is to be avoided, since these can have the effect of oxidation of the powder particles and the oxygen content in the layers obtained therefore increases.

These processes are known to the person skilled in the art, for example, as cold gas spraying, cold spray processes, cold gas dynamic spraying, kinetic spraying and are described, for example, in EP-A-484533. The process described in the patent DE-A-10253794 is likewise also suitable according to the invention. The so-called cold spray process or the kinetic spray process are particularly suitable for the process according to the invention; the cold spray process which is described in EP-A-484533, to which reference is expressly made, is suitable in particular.

Throughout the application the term cold spray is used. It is understood that it is possible to use a kinetic spray process instead of the cold spray process in the instances only a cold spray process is referred to.

A process for application of coatings to surfaces of sputter targets or of X-ray anodes which is thus advantageously employed is a process wherein a gas flow forms a gas/powder mixture with a powder of a material chosen from the group consisting of niobium, tantalum, tungsten, molybdenum, titanium, zirconium, mixtures of at least two thereof or alloys thereof with one another or other metals, the powder has a particle size of 0.5 to 150 µm, wherein a supersonic speed is imparted to the gas flow and a jet of supersonic speed which ensures a speed of the powder in the gas/powder mixture of 300 to 2,000 m/s, preferably 300 to 1,200 m/s, is formed and the jet is directed on to the surface of an object.

On the surface of the object, the impinging metal powder particles form a layer, the particles becoming severely deformed. The powder particles are advantageously present in the jet in an amount which ensures a flow rate density of the particles of from 0.01 to 200 g/s cm², preferably 0.01 to 100 g/s cm², very preferably 0.01 g/s cm² to 20 g/s cm², or most preferred from 0.05 g/s cm² to 17 g/s cm².

The flow rate density is calculated from the formula $F=m/(\pi/4 \cdot D^2)$, where F=flow rate density, D=nozzle cross-section, m=powder delivery rate. A powder delivery rate of e.g. 70 g/min=1.1667 g/s is a typical example of a powder delivery rate.

At low D values of below 2 mm values of markedly greater than 20 g/s cm² can be achieved. In this case F can easily assume values 50 g/s cm² or even higher at higher powder delivery rates.

An inert gas, such as argon, neon, helium or nitrogen or mixtures of two or more thereof, is in general used as the gas with which the metal powder forms a gas/powder mixture.

In particular cases, air can also be used. If safety regulations are met also use of hydrogen or mixtures of hydrogen with other gases can be used.

In a preferred version of the process the spraying comprises the steps of:

providing a spraying orifice adjacent a surface to be coated by spraying;

providing to the spraying orifice a powder of a particulate material chosen from the group consisting of niobium, tantalum, tungsten, molybdenum, titanium, zirconium, mixtures of at least two thereof or alloys thereof with one another or other metals, the powder having a particle size of 0.5 to 150 µm, said powder being under pressure;

providing an inert gas under pressure to the spraying orifice to establish a static pressure at the spraying orifice and providing a spray of said particulate material and gas onto the surface to be coated; and locating the spraying orifice in a region of low ambient pressure which is less than 1 atmosphere and which is substantially less than the static pressure at the spraying orifice to provide substantial acceleration of the spray of said particulate material and gas onto said surface to be coated.

In another preferred version of the process the spraying is performed with a cold spray gun and the target to be coated and the cold spray gun are located within a vacuum chamber at pressures below 80 kPa, preferably between 0.1 and 50 kPa, and most preferred between 2 and 10 kPa.

Further advantageous embodiments can be seen from the claims.

The refractory metal, which is employed in powder form as the powder according to the invention, in general has a purity of 99% or more, such as 99.5% or 99.7% or 99.9%.

According to the invention, the refractory metal advantageously has a purity of at least 99.95%, based on metallic impurities, in particular at least 99.995% or at least 99.999%, in particular at least 99.9995%.

If an alloy is employed instead of an individual refractory metal, at least the refractory metal has this purity, but preferably the entire alloy has this purity, so that a corresponding highly pure layer can be produced.

The metal powder moreover has an oxygen content of less than 1,000 ppm oxygen, or less than 500, or less than 300, in particular an oxygen content of less than 100 ppm.

Refractory metal powders having a purity of at least 99.7%, advantageously of at least 99.9%, in particular 99.95%, and a content of less than 1,000 ppm oxygen, or less than 500 ppm oxygen, or less than 300 ppm oxygen, in particular an oxygen content of less than 100 ppm, are suitable in particular.

Refractory metal powders having a purity of at least 99.95%, in particular of at least 99.995%, and a content of less than 1,000 ppm oxygen, or less than 500 ppm oxygen, or less than 300 ppm oxygen, in particular an oxygen content of less than 100 ppm, are suitable in particular.

Refractory metal powders having a purity of at least 99.999%, in particular of at least 99.9995%, and a content of less than 1,000 ppm oxygen, or less than 500 ppm oxygen, or less than 300 ppm oxygen, in particular an oxygen content of less than 100 ppm, are suitable in particular.

In all the abovementioned powders, the total content of other non-metallic impurities, such as carbon, nitrogen or hydrogen, should advantageously be less than 500 ppm, preferably less than 150 ppm.

In particular, the oxygen content is advantageously 50 ppm or less, the nitrogen content is 25 ppm or less and the carbon content is 25 ppm or less.

The content of metallic impurities is advantageously 500 ppm or less, preferably 100 ppm or less and most preferably 50 ppm or less, in particular 10 ppm or less.

Suitable metal powders are, for example, many of the refractory metal powders which are also suitable for the production of capacitors.

Such metal powders can be prepared by reduction of a refractory metal compound with a reducing agent, and preferably subsequent deoxidation. In this procedure, for example, tungsten oxide or molybdenum oxide is reduced in a stream of hydrogen at elevated temperature. The preparation is described, for example, in Schubert, Lassner, "Tungsten", Kluwer Academic/Plenum Publishers, New York, 1999 or Brauer, "Handbuch der Präparativen Anorganischen Chemie", Ferdinand Enke Verlag Stuttgart, 1981, p. 1530.

In the case of tantalum and niobium, the preparation is usually carried out by reduction of alkali metal heptafluorotantalates and earth alkaline metal heptafluorotantalates or the oxides, such as, for example, sodium heptafluorotantalate, potassium heptafluoro tantalate, sodium heptafluoroniobate or potassium heptafluoroniobate, with an alkali metal or alkaline earth metal. In this procedure, the reduction can be carried out in a salt melt with the addition of, for example, sodium, or in the gas phase, calcium vapour or magnesium vapour advantageously being used. The refractory metal compound can also be mixed and heated with the alkali metal or alkaline earth metal. A hydrogen atmosphere may be advantageous. Numerous suitable processes are known to the person skilled in the art, and process parameters from which he can choose the suitable reaction conditions are known. Suitable processes are described, for example, in U.S. Pat. No. 4,483,819 and WO 98/37249.

After the reduction, a deoxidation advantageously takes place. This can be effected, for example, by mixing the refractory metal powder with Mg, Ca, Ba, La, Y or Ce and subsequent heating, or heating the refractory metal in the presence of a getter substance in an atmosphere which renders possible transfer of oxygen from the metal powder to the getter substance. The refractory metal powder is then usually freed from the salts of the deoxidizing agent with an acid and water and dried. It is advantageous here if, when metals are used for decreasing the oxygen content, the metallic impurities can be kept low.

A further process for the preparation of pure powders having a low oxygen content comprises reduction of a refractory metal hydride with an alkaline earth metal as the reducing agent, thus such as disclosed, for example, in WO 01/12364 and EP-A-1200218.

The invention moreover relates to a process for reprocessing or production of a sputter target (source of metal in cathode sputtering of metal), wherein a gas flow forms a gas/powder mixture with a powder of a material chosen from the group consisting of niobium, tantalum, tungsten, molybdenum, titanium, zirconium or mixtures of two or more thereof or alloys thereof with at least two thereof or with other metals, the powder has a particle size of 0.5 to 150 µm, wherein a supersonic speed is imparted to the gas flow and the jet of supersonic speed is directed on to the surface of the object to be reprocessed or produced.

A sputter target is a source of metal in the cathode sputtering of metal. These are employed in the production of integrated circuits, semiconductors and other electrical, magnetic and optical products. During the sputtering process, in general the metal surface of the sputter target is worn away non-uniformly, which leads to a furrow on the surface. To avoid contamination with the material of the backing plate or even a catastrophic breakthrough of cooling liquid, the sputter targets are not used until the refractory metal layer is used up, but are taken out of service promptly beforehand, so that only a relatively small amount of the refractory metal is used up when a new sputter target is employed. However, the majority can merely be sold as scrap, or their materials recycled, since removal of the backing plate is required and connection to a new refractory metal plate is necessary. The backing plate here, however, is the part of the sputter target which is of lower value.

There is therefore a need for a technique which either renders possible reprocessing of a sputter target without having to detach the backing plate for this or which renders possible to deposit the sputter material direct to the backing.

For this purpose, the furrow in a used sputter target is topped up again with the particular refractory metal by the cold spray process, as described above. For this, the jet of supersonic speed of the gas/powder mixture is directed on to the furrow and moved over the complete length and shape of the furrow. This is repeated as often as is necessary to top up the furrow again, so that the surface of the sputter target forms a substantially flat area again and/or the topped-up material is raised slightly above the surface of the sputter target. Preferably, the jet of supersonic speed of the gas/powder mixture is then directed on to the remaining surface of the sputter target and guided over the complete length, breadth and shape of the sputter target surface until a uniformly thick and flat layer which completely covers the surface of the sputter target has been obtained. The rough surface obtained can then be ground and polished by the conventional processes, so that the desired smooth surface is obtained.

During production of a new sputter target, the layer is applied to a backing plate. Depending upon the construction of the target the jet of supersonic speed of the gas/powder mixture is therefore either directed on to the complete surface of the backing plate of the sputter target and guided over the complete length, breadth and shape of the sputter target surface, until a uniformly and sufficiently thick and flat layer which completely covers the surface of the sputter target has been obtained or only the contact area of the plasma is coated which results in a considerable saving of material.

The layer thickness is usually more than 0.01 mm. Preferred are layers with a thickness between 0.1 and 100 mm, more preferred between 0.5 and 50 mm, still more preferred between 5 and 45 mm, still more preferred between 8 and 40 mm, still more preferred between 10 and 30 mm, still more preferred between 10 and 20 mm and most preferred between 10 and 15 mm.

The purities and oxygen contents of the layers obtained should deviate not more than 50% and preferably not more than 20% from those of the powder.

This can advantageously be achieved if the sputter target to be reprocessed is coated under an inert gas. Argon is advantageously used as the inert gas, since because of a higher density than air, it tends to cover the object to be coated and to remain present, especially if the sputter target is in a vessel which prevents the argon from escaping or flowing out and argon is topped up continuously.

The process according to the present invention is particularly suitable for the processing or production of sputtering targets, because on the one hand during production by thermomechanical processes crystallographic preferred orientations which can change at different intervals often occur, so that no uniform texture is obtained and instead so-called bands, that is to say regions of different preferred orientations. In thermo-mechanical processes, this can be prevented only with a high outlay. In contrast, a uniform texture in which the preferred orientations vary, for example, less than 30% with respect to any desired plane on the surface, these planes running perpendicular, parallel or diagonally to the normal to the surface, and the preferred orientations varying by less than 30% over the thickness of the refractory metal layer, may be obtained by the process according to the invention.

A uniform particle size distribution (grain size) is likewise obtained in the layers, so that also no bands of different particle size are obtained if this is not desired.

In processes in which powder is applied to the sputter target and melted, experience shows that bubbling and particle growth occurs. This also cannot be observed in the process according to the invention.

After application of the layer, the surface of the sputter target must be ground and polished in order to obtain a suitable smooth surface. This can be carried out by the conventional processes according to the prior art.

In the production of a new sputter target, the layer is applied to a backing means, e.g. to a backing plate. This plate is in general a plate of copper or aluminium or an alloy of at least one of these metals with beryllium. This backing plate can contain channels in which there is a cooling medium.

The backing plate and therefore also the sputter target can be in the form of a plate having a circular or angular cross-section, as a rod, cylinder, block or any other desired shape. Additional structural components liquid cooling coils and/or a larger coolant reservoir and/or complex flanges or other mechanical or electrical structures can also be attached.

The layers which are applied according to the invention, or layers which are produced during production or reprocessing of a sputter target, have a high purity and a low oxygen content.

These layers advantageously have an oxygen content of less than 1,000 ppm oxygen, or less than 500, or less than 300, in particular an oxygen content of less than 100 ppm.

In particulars these layers have a purity of at least 99.7%, advantageously of at least 99.9%, in particular of at least 99.95%, and a content of less than 1,000 ppm oxygen, or less than 500 ppm oxygen, or less than 300 ppm oxygen, in particular an oxygen content of less than 100 ppm.

In particular, these layers have a purity of at least 99,95%, in particular of at least 99.995%, and a content of less than 1,000 ppm oxygen, or less than 500 ppm oxygen, or less than 300 ppm oxygen, in particular an oxygen content of less than 100 ppm.

In particular, these layers have a purity of 99.999%, in particular of at least 99.9995%, and a content of less than 1,000 ppm oxygen, or less than 500 ppm oxygen, or less than 300 ppm oxygen, in particular an oxygen content of less than 100 ppm.

The layers according to the invention preferably have a total content of other non-metallic impurities, such as carbon, nitrogen or hydrogen, which is advantageously less than 500 ppm and most preferably less than 150 ppm. With the process of this invention layers with higher impurity contents can also be produced.

The layer applied has a content of gaseous impurities which deviates not more than 50%, or not more than 20%, or not more than 10%, or not more than 5%, or not more than 1% from the content of the starting powder with which this layer has been produced. In this context, the term deviation is to be understood as meaning, in particular, an increase; the layers obtained should thus advantageously have a content of gaseous impurities which is not more than 50% above the content of the starting powder.

The layer applied preferably has an oxygen content which deviates not more than 5%, in particular not more than 1% from the oxygen content of the stating powder.

In all the abovementioned layers, the total content of other non-metallic impurities, such as carbon, nitrogen or hydrogen, should advantageously be less than 500 ppm and most preferably less than 150 ppm.

In particular, the oxygen content is advantageously 50 ppm or less, the nitrogen content is 25 ppm or less and the carbon content is 25 ppm or less.

The content of metallic impurities is advantageously 50 ppm or less, in particular 10 ppm or less.

In an advantageous embodiment, the layers moreover have a density of at least 97%, preferably greater than 98%, in particular greater than 99% or 99.5%. The density of the layer here is a measure of the closed nature and porosity of the layer. 97% density of a layer means that the layer has a density of 97% of the bulk material. A closed, substantially pore-free layer always has a density of more than 99.5%. The density can be determined either by image analysis of a cross-section image (cross-section) of such a layer, or by helium pyknometry. The latter method is preferred less, since in the case of very dense layers, pores present in layers further-removed from the surface are not detected and a lower porosity than is actually present is therefore measured. The density can be determined by image analysis by first determining the total area of the layer to be investigated in the image section of the microscope, and then relating this area to the areas of the pores. Pores which are far-removed from the surface and close to the interface to the substrate are also recorded by this means. A high density of at least 97%, preferably greater than 98%, in particular greater than 99% or 99.5%, is important in particular in the production or reprocessing of sputter targets.

The layers show high mechanical strength which is caused by their high density and by the high deformation of the particles. In the case of tantalum, the strengths are therefore at least 80 MPa, more preferably at least 100 MPa, most preferably at least 140 MPa if nitrogen is the gas with which the metal powder forms a gas/powder mixture.

If helium is used, the strength usually is at least 150 MPa, preferably at least 170 MPa, most preferably at least 200 MPa and very most preferred greater than 250 MPa.

The present invention therefore also relates to sputter targets comprising at least one layer of the refractory metals niobium, tantalum, tungsten, molybdenum, titanium, zirconium, mixtures of two or more thereof or alloys of two or more thereof or alloys with other metals which have the abovementioned properties.

In particular, the layers are layers of tantalum or niobium.

Preferably layers of tungsten, molybdenum, titanium zirconium or mixtures of two or more thereof or alloys of two or more thereof or alloys with other metals, very preferably layers of tantalum or niobium, are applied by cold spraying to the surface of a substrate to be coated. Surprisingly it has been found that with said powders or powder mixtures, preferably with tantalum and niobium powders, possessing a reduced oxygen content, for example an oxygen content below 1000 ppm there can be produced cold sprayed layers with very high deposition rates of more than 90%. In said cold sprayed layers the oxygen content of the metal is nearly unchanged compared to the oxygen content of the powders. These cold sprayed layers show considerably higher densities than layers produced by plasma spraying or by vacuum spraying. Furthermore, these cold sprayed layers can be produced without any or with small texture, depending on powder properties and coating parameters.

Sputter targets comprising cold sprayed layers produce in the sputtering process thin layers showing an uniformity and an electric resistivity comparable with thin layers prepared with conventional sputter targets.

Surprisingly it has been found that with decreasing oxygen content of the cold sprayed target layers density and other properties of the sputtered layers are improved.

Metal powders which comprise alloys, pseudo-alloys and powder mixtures of refractory metals with suitable non-refractory metals are also suitable for use in the processes according to the invention. Sputtering targets which the same alloy or pseudo-alloy can be reprocessed or also produced therewith. These include, in particular, alloys, pseudo-alloys or powder mixtures of a refractory metal chosen from the group consisting of niobium, tantalum, tungsten, molybdenum, zirconium and titanium with a metal chosen from the group consisting of cobalt, nickel, rhodium, palladium, platinum, copper, silver and gold. Such powders belong to the prior art, are known in principle to the person skilled in the art and are described, for example, in EP-A-774315 and EP-A-1138420. These can be prepared by conventional processes; thus, powder mixtures are obtainable by homogeneous mixing of ready-made metal powders, it being possible for the mixing to take place on the one hand before the use in the process according to the invention, or also to be carried out during production of the gas/powder mixture.

Alloy powders are usually obtainable by melting and mixing of the alloying partners together. According to the invention, so-called pre-alloyed powders can also be used as alloy powders. These are powders which are produced by a process in which compounds, such as e.g. salts, oxides and/or hydrides, of the alloying partners are mixed and then reduced, so that intimate mixtures of the particular metals are obtained.

Pseudo-alloys can moreover also be used according to the invention. Pseudo-alloys are understood as meaning materials which are obtained not by conventional melt metallurgy, but e.g. by grinding, sintering, infiltration or by spray drying/agglomerating with and without subsequent sintering of the materials together.

Known materials are, for example, tungsten/copper alloys or tungsten/copper mixtures, the properties of which are known and are listed here by way of example:

| Type | Density (g/cm³) | HB (MPa) | Electrical conductivity (% IACS) | Thermal expansion coefficient (ppm/K) | Thermal conductivity (W/m · K) |
|---|---|---|---|---|---|
| WCu10 | 16.8-17.2 | ≧2,550 | >27 | 6.5 | 170-180 |
| WCu15 | 16.3 | | | 7.0 | 190-200 |
| WCu20 | 15.2-15.6 | ≧2,160 | >34 | 8.3 | 200-220 |
| WCu25 | 14.5-15.0 | ≧1,940 | >38 | 9.0 | 220-250 |
| WCu30 | 13.8-14.4 | ≧1,720 | >42 | | |

Molybdenum/copper alloys or molybdenum/copper mixtures in the same ratios as stated above are also known.

Molybdenium/silver alloys or molybdenum/silver mixtures which comprise e.g. 10, 40 or also 65 wt. % molybdenum are also known.

Tungsten/silver alloys or tungsten/silver mixtures which comprise e.g. 10, 40 or also 65 wt. % tungsten are also known.

These can be employed e.g. in heatpipes, heat sinks or, generally, temperature management systems.

Tungsten/rhenium alloys can also be employed, but the metal powder is an alloy of the following composition: molybdenum 94 to 99 wt. %, preferably 95 to 97 wt. %, niobium 1 to 6 wt. %, preferably 2 to 4 wt. %, zirconium 0.05 to 1 wt. %, preferably 0.05 to 0.02 wt. %. Like pure refractory metal powders, these alloys can be used in a purity of at least 99.95% for reprocessing or production of sputter targets with cold gas spraying.

Materials which are suitable for the processes according to the invention are listed in Tables 1 to 15. Individual materials are designated by the number of the table followed by the number of the combination of the components and the amount of the non-refractory metal as in Table 1. For example, material 22.0005 is a material described in Table 22, wherein the precise composition is defined with the non-refractory metal and the amount thereof as listed in Table 1, position no. 5.

Suitable niobium alloys are listed in Table 1.

TABLE 1

| No. | Refractory metal | Non-refractory metal | Amount of non-refractory metal (wt. %) |
|---|---|---|---|
| 1.001 | niobium | cobalt | 2-5 |
| 1.002 | niobium | nickel | 2-5 |
| 1.003 | niobium | rhodium | 2-5 |
| 1.004 | niobium | palladium | 2-5 |
| 1.005 | niobium | platinum | 2-5 |
| 1.006 | niobium | copper | 2-5 |
| 1.007 | niobium | silver | 2-5 |
| 1.008 | niobium | gold | 2-5 |
| 1.009 | niobium | cobalt | 5-10 |
| 1.010 | niobium | nickel | 5-10 |
| 1.011 | niobium | rhodium | 5-10 |
| 1.012 | niobium | palladium | 5-10 |
| 1.013 | niobium | platinum | 5-10 |
| 1.014 | niobium | copper | 5-10 |
| 1.015 | niobium | silver | 5-10 |
| 1.016 | niobium | gold | 5-10 |
| 1.017 | niobium | cobalt | 10-15 |
| 1.018 | niobium | nickel | 10-15 |
| 1.019 | niobium | rhodium | 10-15 |
| 1.020 | niobium | palladium | 10-15 |
| 1.021 | niobium | platinum | 10-15 |
| 1.022 | niobium | copper | 10-15 |
| 1.023 | niobium | silver | 10-15 |
| 1.024 | niobium | gold | 10-15 |
| 1.025 | niobium | cobalt | 15-20 |
| 1.026 | niobium | nickel | 15-20 |
| 1.027 | niobium | rhodium | 15-20 |
| 1.028 | niobium | palladium | 15-20 |
| 1.029 | niobium | platinum | 15-20 |
| 1.030 | niobium | copper | 15-20 |
| 1.031 | niobium | silver | 15-20 |
| 1.032 | niobium | gold | 15-20 |
| 1.033 | niobium | cobalt | 20-25 |
| 1.034 | niobium | nickel | 20-25 |
| 1.035 | niobium | rhodium | 20-25 |
| 1.036 | niobium | palladium | 20-25 |
| 1.037 | niobium | platinum | 20-25 |
| 1.038 | niobium | copper | 20-25 |
| 1.039 | niobium | silver | 20-25 |
| 1.040 | niobium | gold | 20-25 |
| 1.041 | niobium | cobalt | 25-30 |
| 1.042 | niobium | nickel | 25-30 |
| 1.043 | niobium | rhodium | 25-30 |
| 1.044 | niobium | palladium | 25-30 |
| 1.045 | niobium | platinum | 25-30 |
| 1.046 | niobium | copper | 25-30 |
| 1.047 | niobium | silver | 25-30 |
| 1.048 | niobium | gold | 25-30 |

Table 2: Table 2 consists of 48 alloys, tantalum instead of niobium being the refractory metal and the non-refractory metal and its content in percent by weight being as listed in Table 1.

Table 3: Table 3 consists of 48 alloys, tungsten instead of niobium being the refractory metal and the non-refractory metal and its content in percent by weight being as listed in Table 1.

Table 4: Table 4 consists of 48 alloys, molybdenum instead of niobium being the refractory metal and the non-refractory metal and its content in percent by weight being as listed in Table 1.

Table 5: Table 5 consists of 48 alloys, titanium instead of niobium being the refractory metal and the non-refractory metal and its content in percent by weight being as listed in Table 1.

Table 6: Table 6 consists of 48 pseudo-alloys, tantalum instead of niobium being the refractory metal and the non-refractory metal and its content in percent by weight being as listed in Table 1.

Table 7: Table 7 consists of 48 pseudo-alloys, tungsten instead of niobium being the refractory metal and the non-refractory metal and its content in percent by weight being as listed in Table 1.

Table 8: Table 8 consists of 48 pseudo-alloys, molybdenum instead of niobium being the refractory metal and the non-refractory metal and its content in percent by weight being as listed in Table 1.

Table 9: Table 9 consists of 48 pseudo-alloys, titanium instead of niobium being the refractory metal and the non-refractory metal and its content in percent by weight being as listed in Table 1.

Table 10: Table 10 consists of 48 powder mixtures, tantalum instead of niobium being the refractory metal and the non-refractory metal and its content in percent by weight being as listed in Table 1.

Table 11: Table 11 consists of 48 powder mixtures, tungsten instead of niobium being the refractory metal and the non-refractory metal and its content in percent by weight being as listed in Table 1.

Table 12: Table 12 consists of 48 powder mixtures, molybdenum instead of niobium being the refractory metal and the non-refractory metal and its content in percent by weight being as listed in Table 1.

Table 13: Table 13 consists of 48 powder mixtures, titanium instead of niobium being the refractory metal and the non-refractory metal and its content in percent by weight being as listed in Table 1.

Table 14: Table 14 consists of 48 pseudo-alloys, niobium being the refractory metal and the non-refractory metal and its content in percent by weight being as listed in Table 1.

Table 15: Table 15 consists of 48 powder mixtures, niobium being the refractory metal and the non-refractory metal and its content in percent by weight being as listed in Table 1.

Metal powders which comprise alloys, pseudo-alloys and powder mixtures of different refractory metals with one another are also suitable for use in the processes according to the invention.

Thus, for example, alloys of molybdenum and titanium in the ratio of 50:50 atom-percent or also alloys of tungsten and titanium in an amount of about 90:10 percent by weight are known and are suitable for use in the processes according to the invention.

In principle, however, all alloys of the refractory metals with one another are suitable for use in the processes according to the invention.

Binary alloys, pseudo-alloys and powder mixtures of refractory metals which are suitable for the processes according to the invention are listed in Tables 16 to 36. Individual materials are designated by the number of the table, followed by the number of the combination of the components as in Table 16. For example, material 22.005 is a material described in Table 22, wherein the precise composition is defined by the refractory metals listed in Table 16, position no. 5 and the amount as listed in Table 22.

TABLE 16

Suitable binary refractory metal alloys

| | Component 1 | Component 2 |
| --- | --- | --- |
| 16.001 | Nb | Ta |
| 16.002 | Nb | W |
| 16.003 | Nb | Mo |
| 16.004 | Nb | Ti |
| 16.005 | Ta | Nb |
| 16.006 | Ta | W |
| 16.007 | Ta | Mo |
| 16.008 | Ta | Ti |
| 16.009 | W | Ta |
| 16.010 | W | Nb |
| 16.011 | W | Mo |
| 16.012 | W | Ti |
| 16.013 | Mo | Ta |
| 16.014 | Mo | Nb |
| 16.015 | Mo | W |
| 16.016 | Mo | Ti |
| 16.017 | Ti | Ta |
| 16.018 | Ti | Nb |
| 16.019 | Ti | W |
| 16.020 | Ti | Mo |

Table 17: Table 17 consists of 20 alloys, pseudo- and alloys powder mixtures according to Table 16, wherein component 1 is present in an amount of 2-5 percent by weight, component 2 is present in an amount to 100 percent by weight and the individual mixture partners is as listed in Table 16.

Table 18: Table 18 consists of 20 alloys, pseudo-alloys and powder mixtures according to Table 16, wherein component 1 is present in an amount of 5-10 percent by weight, component 2 is present in an amount to 100 percent by weight and the individual components are as listed in Table 16.

Table 19: Table 19 consists of 20 alloys, pseudo-alloys and powder mixtures according to Table 16, wherein component 1 is present in an amount of 10-15 percent by weight, component 2 is present in an amount to 100 percent by weight and the individual mixture partners are as listed in Table 16.

Table 20: Table 20 consists of 20 alloys, pseudo-alloys and powder mixtures according to Table 16, wherein component 1 is present in an amount of 15-20 percent by weight, component 2 is present in an amount to 100 percent by weight and the individual mixture partners are as listed in Table 16.

Table 21: Table 21 consists of 20 alloys, pseudo-alloys and powder mixtures according to Table 16, wherein component 1 is present in an amount of 20-25 percent by weight, component 2 is present in an amount to 100 percent by weight and the individual mixture partners are as listed in Table 16.

Table 22: Table 22 consists of 20 alloys, pseudo-alloys and powder mixtures according to Table 16, wherein component 1 is present in an amount of 25-30 percent by weight, component 2 is present in an amount to 100 percent by weight and the individual mixture partners are as listed in Table 16.

Table 23: Table 23 consists of 20 alloys, pseudo-alloys and powder mixtures according to Table 11, wherein component 1 is present in an amount of 30-35 percent by weight, component 2 is present in an amount to 100 percent by weight and the individual mixture partners are as listed in Table 16.

Table 24: Table 24 consists of 20 alloys, pseudo-alloys and powder mixtures according to Table 16, wherein component 1 is present in an amount of 35-40 percent by weight, component 2 is present in an amount to 100 percent by weight and the individual mixture partners are as listed in Table 16.

Table 25: Table 25 consists of 20 alloys, pseudo-alloys and powder mixtures according to Table 16, wherein component 1 is present in an amount of 40-45 percent by weight, component 2 is present in an amount to 100 percent by weight and the individual mixture partners are as listed in Table 16.

Table 26: Table 26 consists of 20 alloys, pseudo-alloys and powder mixtures according to Table 16, wherein component 1 is present in an amount of 45-50 percent by weight, component 2 is present in an amount to 100 percent by weight and the individual mixture partners are as listed in Table 16.

Table 27: Table 27 consists of 20 alloys, pseudo-alloys and powder mixtures according to Table 16, wherein component 1 is present in an amount of 50-55 percent by weight, component 2 is present in an amount to 100 percent by weight and the individual mixture partners are as listed in Table 16.

Table 28: Table 28 consists of 20 alloys, pseudo-alloys and powder mixtures according to Table 16, wherein component 1 is present in an amount of 55-60 percent by weight, component 2 is present in an amount to 100 percent by weight and the individual mixture partners are as listed in Table 16.

Table 29: Table 29 consists of 20 alloys, pseudo-alloys and powder mixtures according to Table 16, wherein component 1 is present in an amount of 60-65 percent by weight, component 2 is present in an amount to 100 percent by weight and the individual mixture partners are as listed in Table 16.

Table 30: Table 30 consists of 20 alloys, pseudo-alloys and powder mixtures according to Table 16, wherein component 1 is present in an amount of 65-70 percent by weight, component 2 is present in an amount to 100 percent by weight and the individual mixture partners are as listed in Table 16.

Table 31: Table 31 consists of 20 alloys, pseudo-alloys and powder mixtures according to Table 16, wherein component 1 is present in an amount of 70-75 percent by weight, component 2 is present in an amount to 100 percent by weight and the individual mixture partners are as listed in Table 16.

Table 32: Table 32 consists of 20 alloys, pseudo-alloys and powder mixtures according to Table 16, wherein component 1 is present in an amount of 75-80 percent by weight, component 2 is present in an amount to 100 percent by weight and the individual mixture partners are as listed in Table 16.

Table 33: Table 33 consists of 20 alloys, pseudo-alloys and powder mixtures according to Table 16, wherein component 1 is present in an amount of 80-85 percent by weight, component 2 is present in an amount to 100 percent by weight and the individual mixture partners are as listed in Table 16.

Table 34: Table 34 consists of 20 alloys, pseudo-alloys and powder mixtures according to Table 16, wherein component 1 is present in an amount of 85-90 percent by weight, component 2 is present in an amount to 100 percent by weight and the individual mixture partners are as listed in Table 16.

Table 35: Table 35 consists of 20 alloys, pseudo-alloys and powder mixtures according to Table 16, wherein component 1 is present in an amount of 90-95 percent by weight, component 2 is present in an amount to 100 percent by weight and the individual mixture partners are as listed in Table 16.

Table 36: Table 36 consists of 20 alloys, pseudo-alloys and powder mixtures according to Table 16, wherein component 1 is present in an amount of 95-99 percent by weight, component 2 is present in an amount to 100 percent by weight and the individual mixture partners are as listed in Table 16.

In principle, X-ray anodes, preferably X-ray rotating anodes can also be reprocessed or produced in the same manner as sputter targets. In particular, tungsten/rhenium alloys or the metal powder an alloy of the following composition are suitable: molybdenum 94 to 99 wt. %, preferably 95 to 97 wt. %, niobium 1 to 6 wt. %, preferably 2 to 4 wt.%, zirconium 0.05 to 1 wt. %, preferably 0.05 to 0.02 wt. %.

X-ray anodes, preferably X-ray rotating anodes often carry on their reverse a usually soldered-on graphite layer for dissipation of heat. This layer for dissipation of heat can also be applied by the process of the invention, for example by applying a suitable alloy or a metal powder which comprises graphite particles or particles of another substance having a high thermal capacity with cold gas spraying.

Fabrication of Hollow Cathode Magnetron (HCM) Sputtering Target by Cold Spray

The HCM sputtering target, normally called "HCM Pott", is developed for use in the physical vapor deposition.

A typical HCM pot has a shape like a Bell. The HCM technology, when use in an ionized PVD environment, facilitates more efficient production of ions of target material that are directed at right angles to a substrate being coated. This technology provides a highly directly deposition and offers excellent bottom coverage of high-aspect-ratio features without the use of a collimator (see U.S. Pat. No. 6,283,357). This deposition technology meets and exceeds the demands of the semiconductor industry for sub-0.25 µm devices. Specifically, HCM ionized source technology enables high quality of Ta, TaN, Cu, Ti, TiN and other films to be deposited into sub-0.25 µm dual damascene structure (U.S. Pat. No. 6,283,357).

Normally, the HCM targets is fabricated by casting a billet of target material and then forming the billet into the specially design Pot shape by metal forming techniques, such as forging or deep drawing. The formed target is then machined to final dimensions and the process to make such a monolithic target is quite expensive.

Fabrication of Net-shape Parts

One of the advantages for cold spray technology is to make a net shape product. The powder can be directly sprayed upon a suitable substrate to produce a net-shape or near net-shape fabricated parts.

A powder metallurgy is a metal working process used to fabricated parts of simple or complex shape from a wide variety of metals and alloys in the form of powders. The process involves shaping of the powder and subsequent bonding of its individual particles by thermal-mechanical working. The processes include pressing and sintering, powder injection molding, and full-density processing. Examples of full-density processing are hot isostatic pressing/powder forging and spray forming.

Other metal working methods such as casting, forging, extrusion forming, stamping etc. Casting normally involves with molten metal, and forging at softening temperature during fabrication. The characteristic advantage of powder metallurgy are the following: close to tolerances, low cost, net shaping, high production rates, and controlled properties.

The typical spray forming is accomplished by thermal spray. The thermal spray refers to a broad class of processes in which molten droplet of metals, ceramics, glasses, and/or polymer are sprayed onto a substrate to create a coating. Examples of thermal spray process are plasma high velocity oxy fuel (HVOF), Arc and Flame Spray.

The issue for high temperature thermal spray is oxidation, vaporization, melting, and crystallization, which is quite detrimental if the material requirement is low oxygen. Cold spray is an emerging technology which uses powder particles at near room temperature or temperature significantly lower than melting point. Because the process occurs essentially at room temperature environment, copper, tantalum, aluminum, niobium, and other reactive metals can be cold sprayed in an open-air environment without little or no oxidation. Because they generally contain few oxide impurities and less porosity, cold sprayed materials typically have much higher thermal and electrical conductivities than traditional, thermally sprayed materials.

The advantages of cold spray technology are as follows: (1) retaining properties of initial particles, (2) deposition of oxygen-sensitive materials without vacuum, (3) producing coating with low oxide content, (4) coating with high density, (S) coating with high thermal and electrical conductivity, (6) coating with high hardness, cold work microstructure, (7) corrosion-resistant coatings, (8) inter-metallic coatings/repair or rejuvenation, and (9) metal coating on ceramic or glass.

Joining by Cold Spray Technology to Maintain the Composite Structure and Its Strength One of the issues facing the Large-Area Coating is to make Large-Area Sputtering Targets, which requires a joint between adjacent tiled targets with similar composition and superior strength.

Conventional joining technologies such as electron-beam (BB) welding, and hot isostatic press (HIP) bonding are tested with unsatisfactory results. FIG. 17 shows the microstructure of a joint made by electron-beam welding to join two Mo—Ti tiles. The dark areas are porosities, the gray area is the melted Mo—Ti alloy phase, and the white area is Mo phase. The joint is very weak, and can be easily pulled off by hand.

FIG. 18 shows the SEM microstructure of a HIP joint which forms a brittle $3^{rd}$ alloy phase weakening the joint strength.

The cold spray technology is used to join two Mo—Ti targets with excellent bonding strength with microstructure shown in FIG. 19. Comparing FIGS. 17 and 18 with 19, cold spray process can retain a composite powder structure (Mo and Ti powders), while both EB welding and HIP processes either destroying the composite structure or forming a brittle $3^{rd}$ phase, thereby weakening the bond strength.

Cold Spray Materials for Applications in Chemical Process Industry (CPI)

The chemical process industry has three high-priority needs: new materials that would expand the limits of process operating conditions (e.g., higher temperatures and pressure); a better understanding of the operating limits within which existing and new materials could be safely and reliably used; databases and models as tools for reliable, cost-effective predictions of the performance of materials under expected process conditions (e.g. aqueous and nonaqueous conditions and high temperature processes) quoted from Materials Technology Institute 1998.

The materials improvement is needed to withstand aggressive process environments, examples such as improved thermal spray coatings resistant to corrosive liquid environments; more cost-effective, reliable techniques of cladding exotic materials over a steel substrate; materials with improved resistance to high-temperature, high dew point, and liquid halogen-containing environments etc. The cold spray technology has been demonstrated, with an example as shown below, to be able to make a corrosion resistant coating, emerging as an enabling, cost-effective process for improved materials performance.

EXAMPLES

Process for the Preparation of Suitable Powders

Preparation of a Tantalum Powder

A tantalum hydride powder was mixed with 0.3 wt. % magnesium and the mixture was placed in a vacuum oven. The oven was evacuated and filled with argon. The pressure was 860 mmHg and a stream of argon was maintained. The oven temperature was increased up to 650° C. in steps of 50° C. and, after a constant temperature had been established, maintained for four hours. The oven temperature was then increased up to 1,000° C. in steps of 50° C. and, after a constant temperature had been established, maintained for six hours. After this time had elapsed, the oven was switched off and cooled to room temperature under argon. Magnesium and the compounds formed were removed in the conventional manner by washing with acid. The resulting tantalum powder had a particle size of −100 mesh (<150 μm), an oxygen content of 77 ppm and a BET specific surface area of 255 cm$^2$/g.

Preparation of a Titanium Powder

The procedure was as for the preparation of the tantalum powder. A titanium powder having an oxygen content of 93 ppm was obtained.

Preparation of a Pre-Alloyed Titanium/Tantalum Powder

A mixture of tantalum hydride powder and titanium hydride powder in the molar ratio of 1:1 was prepared and mixed with 0.3 wt. % magnesium, and the procedure was as for the preparation of the tantalum powder. A titanium/tantalum powder having an oxygen content of 89 ppm was obtained.

Production of Layers

Layers of tantalum and niobium were produced. AMPERIT® 150.090 was used as the tantalum powder and AMPERIT® 160.090 as the niobium powder, both being commercially obtainable materials from H. C. Starck GmbH in Goslar. The commercially obtainable nozzle of the type MOC 29 from CGT GmbH in Ampfing was used.

|  | Material | | | |
| --- | --- | --- | --- | --- |
|  | Tantalum | Tantalum | Niobium | Niobium |
| Nozzle | MOC 29 | MOC 29 | MOC 29 | MOC 29 |
| Determination of the delivery rate at 0.52 Nm$^3$/h: | | | | |
| 3.0 rpm (g/30 s/g/min) | 35.5/71.0 | 35.5/71.0 | 14.7/23.4 | 14.7/29.4 |
| 4.0 rpm (g/30 s/g/min) | | | 19.8/39.6 | 19.8/39.6 |
| Movement data: | | | | |
| Spray speed/speed of the nozzle over the substrate (m/min) (mm/s) | 20/333 | 20/333 | 20/333 | 20/333 |

-continued

|  | Material | | | |
|---|---|---|---|---|
|  | Tantalum | Tantalum | Niobium | Niobium |
| Line feed (mm) | 1.5 | 1.5 | 1.5 | 1.5 |
| Spray distance (mm) | 30 | 30 | 30 | 30 |
| Process gas: | nitrogen | helium | nitrogen | helium |
| Pressure (bar) | 30 | 28 | 30 | 23 |
| Flow rate (Nm³/h) | 65 | 190/He 181 | 60 | 190/He 181 |
| Content of conveying gas (%) Powder delivery | 8 | 3 (N2) | 3 | 3 (H2) |
| Powder delivery rate (g/min) | 71 | 71 | 39.6 | 39.6 |
| Number of passes | 3 | 3 | 3 | 3 |
| Substrates | 1FTa 1FS 1FV 1FS 1RV 1RS | 1FTa 1FV 2FS 1RV 1RS | 2FS 2FV 1RS 1RV | 2FS 2FV 1RV 1RS |
| Sheet thickness before (mm) | 2.86 | 2.92 | 2.91 | 2.84 |
| Sheet thickness after (mm) | 3.38 | 3.44 | 3.35 | 3.36 |
| Layer thickness, (μm) | 520.00 | 520.00 | 436.00 | 524.00 |
| Porosity/density | 0.9%/99.1% | 2.2%/97.8% | | |

Substrates: The substrates were placed side by side on the sample carrier and coated under the stated test conditions. The substrate designation is composed here as follows:

The first number indicates the number of identical substrates lying side by side. The following letter indicates whether a flat specimen (F) or round specimen (R, tube) has been initially introduced. The subsequent letters indicate the material, where Ta denotes tantalum, 1 a structural steel and V a rustproof steel (chromium/nickel steel).

Very firm and dense layers which have a low porosity and an excellent adhesion to the particular substrates were obtained.

FIGS. 1 to 10 show light microscopy photographs of cross-sections of the tantalum coatings obtained. No inclusions of copper or tungsten such as occur in corresponding layers produced with vacuum plasma spraying are detectable. The porosity was determined automatically by the Imageaccess image analysis program.

Figure 11:
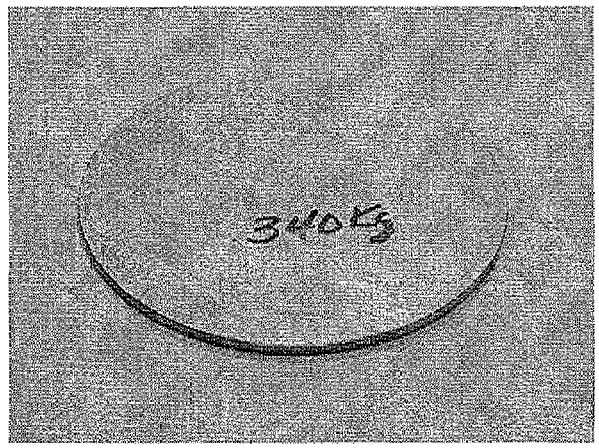
FIG. 11: tantalum disk as sputter target prior to coating.
Figure 12A:
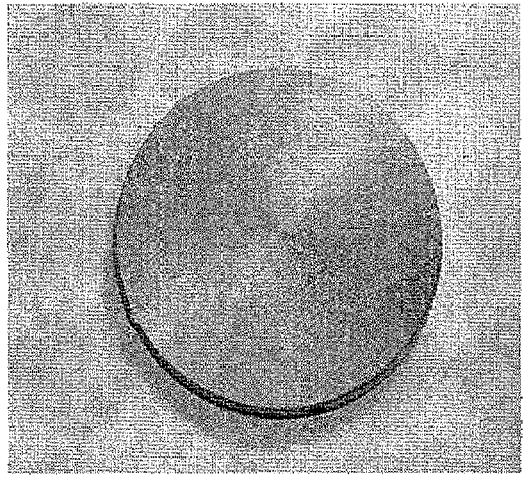
FIG. 12: tantalum disk as sputter target after coating (12a: top view; 12b: side view).
Figure 12B:
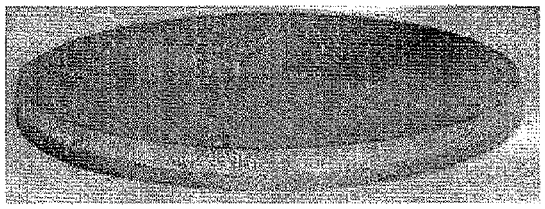
Figure 13:
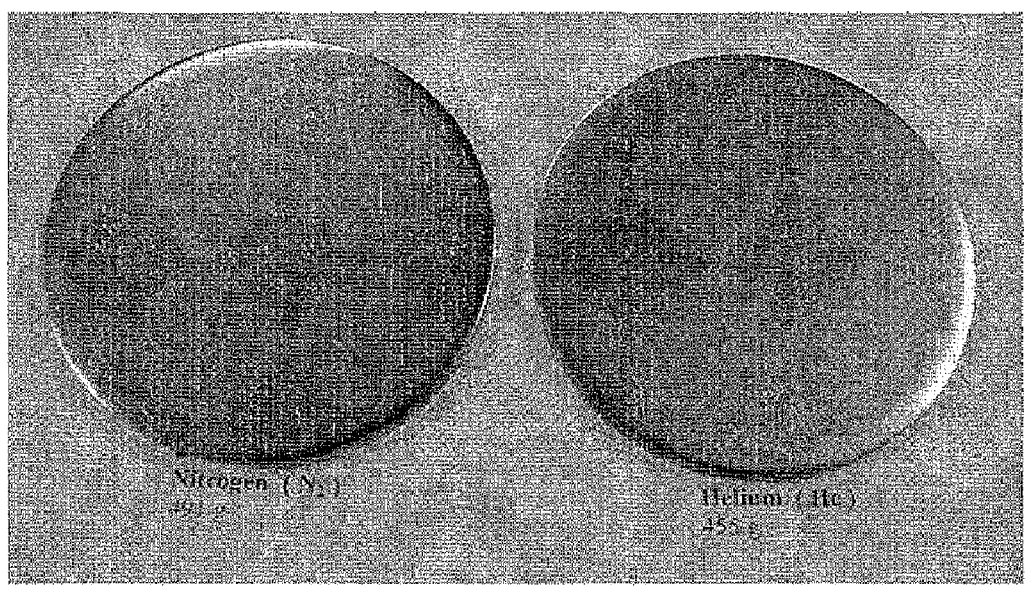
FIG. 13: tantalum disk as sputter target after coating and ready for assembling after grinding and polishing (one disk coated using nitrogen as process gas, one disk coated using helium as process gas).
Figure 14:
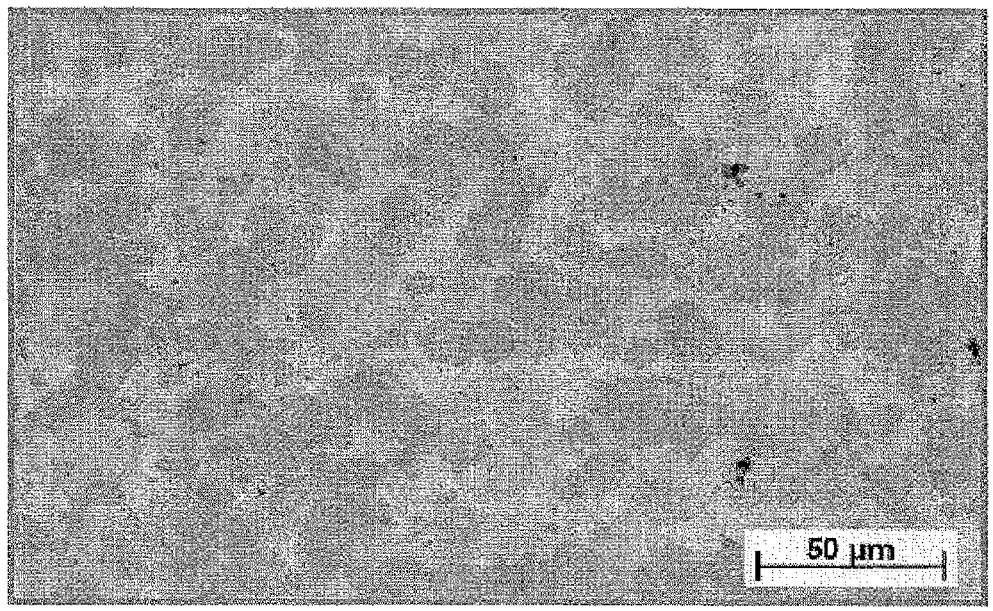
FIG. 14A: the microstructure of W—Cu (50/50 vol %).
FIG. 14B: Cu has a flattened structure.
Figure 14:
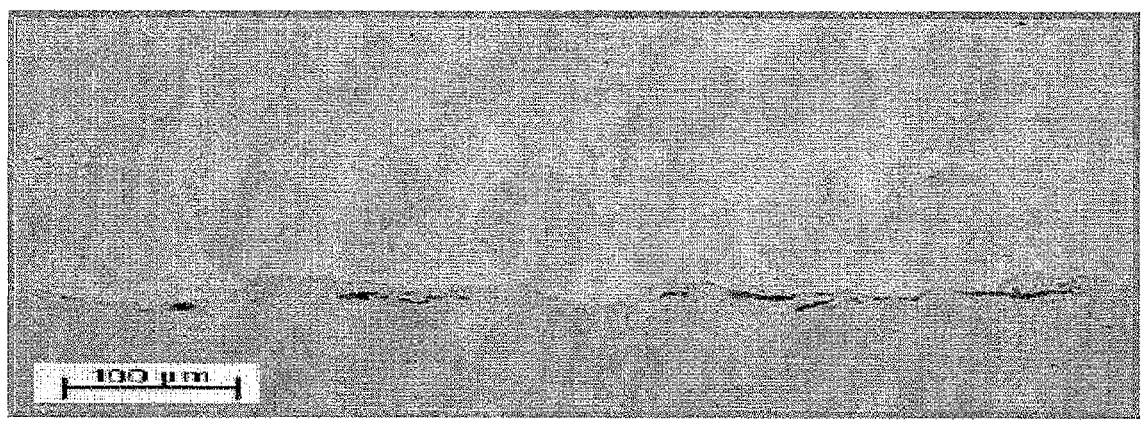

FIGS. 11 to 13 show tantalum disks as sputter targets prior to and after coating and ready for assembling after grinding and polishing Example to Make HCM Pot by Cold Spray. The following procedure was carried out for HCM pot with a schematic drawing as illustrated in FIG. 15.

The first step is to fabricate an expendable copper pot mandrel with dimensions of about 6.0" diameter, 2.25" edge radius, 0.2" wall thickness and 6" total height.

The second step is to cold spray the copper crucible mandrel with tantalum powder (grade Amperit Tantalum Powder with particle size cut ³⁸/₁₀ μm produced by H. C. Starck). The coating thickness is about 0.12"

Once the spray operation is complete, the outside diameter of the tantalum pot will be machined to obtain uniform coating thickness of 0.1".

The copper mandrel will be removed in two steps. First, machining will be used to remove maximum materials and subsequently rest of the materials will be dissolved in dilute nitric acid.

Next, the tantalum pot will be mounted in the lathe and internal surface of the pot will be machined and polished.

In addition to making the tantalum monolithic refractory metal targets by cold spray, as mentioned above, the cold spray technology can directly deposit tantalum coating on niobium or copper substrates (not limited to) to form a clad target assembly in order to have a lighter weight and/or cost less than the monolithic sputtering targets. The powders used for making such coatings can be any of the materials listed in previous Tables 1-36.

Rejuvenation of the spent monolithic HCM pot/target or Clad HCM pot/target can also be made by cold spray process.

Example for Make a Net-shape Tantalum Crucible

The first step is to fabricate an expendable copper crucible mandrel with dimensions 0.7" diameter, 0.01° wall thickness, 0.375" bottom radius and 2.125" total height.

The second step is to cold spray the copper crucible mandrel with tantalum powder (grade Amperit Tantalum Powder with particle size cut ³⁸/₁₀ μm produced by H. C. Starck).

Once the spray operation is complete, the outside diameter of the crucible will be machined to obtain uniform thickness.

Finally, the mandrel will be dissolved. For example the mandrel can be dissolved in an acid such as but not limited to a dilute nitric acid solution, and the final net-shaped fabricated tantalum crucible is shown in FIG. 16.

The applications of such tantalum crucibles are containers for crystal growth, chemical processing due to high temperature and/or corrosion resistance, melting and casting operations; fusion, reaction or incineration of samples for chemical analysis or material synthesis.

In addition to Ta, other refractory metal powder compositions (Nb, W, Mo, Re, Ti, Hf, Zr or their alloys) can also be used by cold spray technology for making such net-shaped crucibles, such as W—Re crucible, Ta—W crucible, Nb—W cruciblesr to name a few.

Joining by Cold Spray Technology to Maintain the Composite Structure and Its Strength The cold spray conditions to make such composite structure are as follows: nitrogen atmosphere at 600-900 C., pressure at 2.0-4.0 MPa, powder feeding rate at 30-90 g/min, and spray distance at 10-80 mm. The preferred conditions are 800-900 C., pressure 3-3.8 MPa, powder feeding rate 40-60 g/min, and spray distance at 20-40 mm.

Example of Corrosion Resistant Tantalum Coatings by Cold Spray Technology

The powders used are Amperit tantalum powder with ³⁸/₁₀ μm particle size cut which is made by H. C. Starck GmbH. The temperatures ranged from 400-600 C. with pressure 2.5-3.5 MPa. The preferred conditions are 500-600 C. and pressure 3.0-3.5 MPa. The coating thickness is 400 μm.

The two specimens were placed in 20% HCl solution at 70 C. for 4 weeks. None of the specimen showed any indication for a corrosion attack. Both Ta coatings on Ta sheet and on steel showed undetectable corrosion rate, 0.01 mm/a, similar to that of tantalum sheet itself, as shown in the microstructures of FIGS. 20 and 21. Both tantalum and niobium coatings can be used as corrosion resistant coatings for chemical process industry. The coatings exhibit flattened grain structures and high density with excellent bonding strength. The coating is also applicable to the coating for tubular heat exchanger for improved corrosion performance.

Cladding for Chemical Process Industry

Tantalum is expensive. In addition to Ta coating for corrosion resistance, there is much interest in a Ta clad steel which is for structural load bearing purpose. As tantalum is a refractory material, it is difficult to bond Ta to steel because it requires high temperature brazing (well above process temperatures) and there is a large CTE mismatch, thus inducing bond failure during cooling. Cold Spray application temperatures are much lower, and would not have the difficulty in the CTE mismatch. The bonding strength for cold spray Ta coating on steel sheet, shown in FIG. 21, can reach as high as 54 MPa.

In addition, composite coating, such as Ta—Mo, Mo—Ti etc., can be achieved, cost-effectively, by cold spray process, without the need of high temperature brazing which forms oxides weakening the coating bond strength.

All the references described above are incorporated by reference in its entirety for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

The invention claimed is:

1. A method of forming a large-area sputtering target, the method comprising:

provding a plurality of sputtering targets each comprising a backing plate and a refractory metal layer disposed thereon; and spray depositing a refractory metal powder on an interface between the sputtering targets, the refractory metal powder consisting essentially of the same metal as each refractory metal layer, thereby joining the refractory metal layers of the sputtering targets and forming the large-area sputtering target.

2. The method of claim 1, wherein each backing plate comprises copper, aluminum, or an alloy of beryllium with at least one of copper or aluminum.

3. The method of claim 1, wherein the refractory metal powder comprises at least one of niobium, tantalum, tungsten, molybdenum, zirconium, or titanium.

4. The method of claim 1, wherein the refractory metal powder is deposited by cold spraying.

5. The method of claim 1, wherein, during the spray depositing of the refractory metal powder, neither the refractory metal powder nor any portion of any backing plate melts.

6. The method of claim 1, wherein an oxygen content of the refractory metal powder prior to spray depositing is substantially equal to an oxygen content of the refractory metal powder after spray depositing.

7. The method of claim 1, further comprising inserting the large-area sputtering target into a sputtering tool without removing any backing plate.

8. The method of claim 1, wherein, after spray deposition, the refractory metal powder is substantially free of preferred crystalline texture.

9. The method of claim 1, wherein, after spray deposition, the refractory metal powder has an oxygen content less than 100 ppm.

* * * * *